United States Patent
Uchihiro et al.

(10) Patent No.: US 7,021,550 B2
(45) Date of Patent: Apr. 4, 2006

(54) PREPARING METHOD OF IC CARD AND IC CARD

(75) Inventors: Shinji Uchihiro, Hino (JP); Ryoji Hattori, Hino (JP)

(73) Assignee: Konica Corporation, (JP)

( * ) Notice: Subject to any disclaimer, the term of this patent is extended or adjusted under 35 U.S.C. 154(b) by 0 days.

(21) Appl. No.: 10/460,857

(22) Filed: Jun. 13, 2003

(65) Prior Publication Data

US 2003/0234294 A1 Dec. 25, 2003

(30) Foreign Application Priority Data

Jun. 19, 2002 (JP) .............................. 2002-178567

(51) Int. Cl.
*G06K 19/06* (2006.01)
(52) U.S. Cl. .................................... 235/492
(58) Field of Classification Search ................ 235/492, 235/485–487, 380, 375
See application file for complete search history.

(56) References Cited

U.S. PATENT DOCUMENTS

| | | | |
|---|---|---|---|
| 4,751,124 A * | 6/1988 | Matsuzawa et al. | 428/65.1 |
| 5,180,906 A * | 1/1993 | Yamada | 235/487 |
| 5,302,438 A * | 4/1994 | Komamura et al. | 428/195.1 |
| 5,689,136 A * | 11/1997 | Usami et al. | 257/679 |
| 5,999,205 A * | 12/1999 | Taguchi et al. | 347/213 |
| 6,076,737 A * | 6/2000 | Gogami et al. | 235/492 |
| 6,203,934 B1 * | 3/2001 | Naoe et al. | 428/694 B |
| 6,250,555 B1 * | 6/2001 | Inamoto | 235/487 |
| 6,297,075 B1 * | 10/2001 | Odajima et al. | 438/110 |
| 6,368,529 B1 * | 4/2002 | Lloyd et al. | 264/109 |
| 6,638,635 B1 * | 10/2003 | Hattori et al. | 428/500 |
| 6,703,121 B1 * | 3/2004 | Iwabuchi et al. | 428/355 AC |
| 2005/0175819 A1 * | 8/2005 | Kobayashi et al. | 428/195.1 |

FOREIGN PATENT DOCUMENTS

| | | |
|---|---|---|
| JP | 01-205155 | 8/1989 |
| JP | 10-316959 | 12/1998 |
| JP | 11-005964 | 1/1999 |
| JP | 2000-036026 | 2/2000 |
| JP | 2000148946 A * | 5/2000 |
| JP | 2000-211278 | 8/2000 |
| JP | 2000-219855 | 8/2000 |
| JP | 2002-175510 | 6/2002 |
| JP | 2002-222403 | 8/2002 |

* cited by examiner

Primary Examiner—Daniel Stcyr
Assistant Examiner—Edwyn Labaze
(74) Attorney, Agent, or Firm—Cantor Colburn LLP

(57) ABSTRACT

A method for preparing an IC card, the IC card has an IC module within an adhesive layer between first substrate and second substrate. In the method, an adhesive containing diphenylmethanediisocyanate an amount of less than percent by weight based on the whole amount the adhesive and having an elongation at fracture adhesive of 150–1,500 percent after complete curing is employed, and the blanc IC card sheet is cut when an elongation at fracture of the adhesive of 5–500 percent prior to complete curing.

16 Claims, 19 Drawing Sheets

PREPARING METHOD OF IC CARD AND IC CARD

BACKGROUND OF THE INVENTION

The present invention relates to a method for preparing an IC card carrying a non-contact type built-in IC module which stores personal information and the like which is required for security such as prevention against forgery and falsification, and an IC card.

In recent years, widely employed as identification cards (ID cards) and credit cards, have been IC cards carrying a built-in chip. Specifically, non-contact type IC cards, which have, in their interior, IC chips and electronic parts such as an antenna which exchanges information with the exterior and have no electric contact points in the exterior, result in higher security compared to contact type IC cards, having an electric contact points on the surface. As a result, non-contact type IC cards have found the use in which data secrecy and prevention of forgery and falsification are highly demanded, as for ID cards. For example, non-contact type IC cards comprise a first sheet material comprising on the outer surface an image receiving layer and a second sheet material comprising on the outer surface a writing layer and an IC module consisting of IC chips and an antenna, sealed by adhesives, which is provided between the aforesaid first sheet material and the aforesaid second sheet material. When an IC card is used as an ID card, in many cases, commonly provided on the image receiving layer side is personal identification information including a name and a portrait and on the other side is a writable surface for the purpose of subsequent description.

SUMMARY OF THE INVENTION

Such IC cards are customarily prepared as follows. An IC module inlet comprising a circuit substrate mounted with IC chips and an antenna is placed between two PET base sheets and adhered employing moisture curing type adhesives, UV curing type adhesives, or 2-liquid mixture type adhesives. After curing, the resulting material is die-cut into a typical card shape.

In order to achieve the desired transportability of supports, while minimizing contraction of supports due to heat, as well as curling due to card base materials, it is required to achieve the aforesaid adhesion at 80° C. or less. Accordingly, low temperature adhesive are used. Of these, moisture curing type adhesives are preferably employed.

However, the aforesaid moisture curing type adhesives commonly comprise diphenylmethanediisocyanate (MDI) in an amount of 3–10 percent. Since MDI is hazardous, it is desirous to minimize its use. When its content is decreased, the resulting adhesive results in a decrease in adhesive force or degradation of storage stability. As a result, an adhesive is demanded which comprises MDI in a minimal amount but achieves the desired adhesion.

In another aspect, when adhesives are used which form non-elastic hard materials after curing, die-cut cards result in clean sides pleasing the touch. Namely, adhesives which result in low elongation at fracture are desired. However, a decrease in elongation at fracture results in an increase of hardness of the adhesives. Thereby the adhesives may not be uniformly applied and the resulting IC cards may result in a decrease in flexibility, whereby the transportability in the card printer is degraded, resulting in problems such that chips are damaged. Accordinly, it has been increasingly demanded to overcome such problems.

From the viewpoint of the foregoing, the present invention was achieved. An objective of the present invention is to provide a method for preparing an IC card which results in excellent coatability as well as excellent cutting properties without degrading physical parameters of the cards and exhibits excellent security, and an IC card.

The present invention and the embodiments thereof will now be described.

A method for preparing an IC card comprises
 supplying an adhesive to a first sheet substrate for forming the first substrate and a second sheet substrate for forming the second substrate to form an adhesive layer,
 supplying an IC module containing an IC chip between the adhesive layers,
 adhering the first and the second sheet substrates to form a blanc IC card sheet having the IC module between the adhesive layers, and
 cutting the blanc IC card sheet to form a blanc IC card,
 wherein the adhesive contains diphenylmethanediisocyanate in an amount of less than 1.0 percent by weight based on the whole amount of the adhesive and has an elongation at fracture of the adhesive of 150–1,500 percent after complete curing, and the blanc IC card sheet is cut when an elongation at fracture of the adhesive of 5–500 percent prior to complete curing.

Said preparation method results in excellent cutting properties as well as excellent security.

A method for preparing an IC card wherein the content of diphenylmethanediisocyanate in the adhesive is less than 1.0 percent, and a card is cut when the elastic modulus of said adhesive is 5–15 kgf/mm$^2$ prior to curing, while the resulting elastic modulus is 15–50 kgf/mm$^2$ after complete curing.

Said preparation method results in excellent cutting properties as well as desired physical properties (stiffness) of said card.

A method for preparing an IC card wherein the content of diphenylmethanediisocyanate in the adhesive is less than 1.0 percent and the viscosity of the resulting adhesive is 5,000–40,000 cp during coating.

Said method results in excellent coatability.

A method for preparing an IC card wherein the content of diphenylmethanediisocyanate in the adhesive is less than 1.0 percent and the softening point of the resulting adhesive is 50–80° C.

Said method results in excellent coatability as well as the desired security.

A method for preparing an IC card wherein IC card is cut when the elongation at fracture of an adhesive is 300–1,000 percent, the cutting blade angle is 20–40 degrees.

Said method results in excellent cutting properties.

A method for preparing an IC card wherein when the elongation at fracture of an adhesive is 5–500 percent, the cutting blade angle is 80–100 degrees.

Said method results in excellent cutting properties.

Since an IC card, which exhibits the desired physical properties (stiffness) is prepared, it is preferable that an ambience during adhesion of sheets is maintained at a temperature of 20–50° C. and a humidity of 70–100 percent.

Since an IC card, which exhibits the desired physical properties (stiffness), is prepared, it is preferable that after adhesion, curing conditions are maintained under a temperature of 20–50° C. and a humidity of 40–100 percent.

It is preferable that prior to die-cutting, an adhered product is cut into sheets.

It is preferable that prior to die-cutting into cards, a format is printed on the interior printing surface. By doing so, format printing accuracy is enhanced.

It is preferable that on at least one side of the first or second sheet substrate, an image receiving layer is provided which includes personal identification information comprising name and portrait printed by a sublimation thermal transfer system, a fusion thermal transfer system, or an ink jet printing system, and a writing layer is provided on at least one section.

By doing so, it is possible to apply the resulting card to licenses such as a driver's license, passports, alien registration cards, library cards, cash cards, credit cards, employee identification cards, company worker identification cards, membership cards, medical cards, and student identification cards.

It is preferable that a transparent protective layer is provided on the upper surface which includes personal identification information comprising name and portrait and said transparent protective layer is comprised of an actinic radiation curing resin.

By this process, personal identification information is secured and durability is enhanced by providing said transparent protective layer on the upper surface which includes personal identification information.

It is preferable that an IC module is provided in a position which does not overlap the portrait.

It is preferable that an IC card is a non-contact type.

Unevenness of the peripheral portion of the IC module of the surface side sheet of an IC card is preferably within ±10 μm with respect to flatness.

BRIEF DESCRIPTION OF THE DRAWINGS

FIG. 4(*a*) is a cross-sectional view of the front sheet; FIG. 4(*b*) is a front view of the front sheet; and FIG. 4(*c*) is a perspective view showing the constitution of the IC card employing the front sheet.

FIG. 5(*a*) is a cross-sectional view of the front sheet; FIG. 5(*b*) is a front view of the front sheet; and FIG. 5(*c*) is a perspective view showing the constitution of the IC card employing the front sheet.

FIG. 6(*a*) is a cross-sectional view of said rear sheet; and FIG. 6(*b*) is a front surface view of said rear sheet.

FIG. 7(*a*) is a cross-sectional view of said rear sheet; and FIG. 7(*b*) is a front surface view of said rear sheet.

EMBODIMENTS

The IC card preparation method and the embodiments of the IC card of the present invention will now be detailed, based on drawings.

Figure 1:
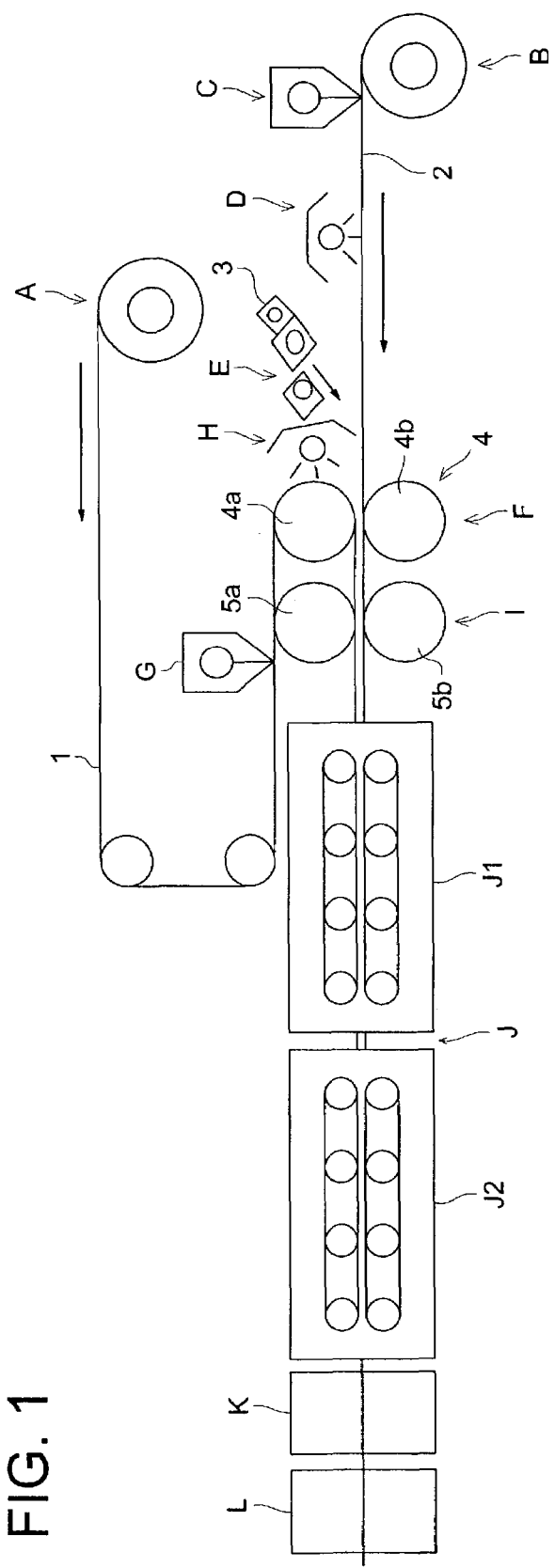
FIG. 1 is a schematic constitution view showing a preparation process of a blank IC card.

FIG. 1 is a schematic constitution view showing an IC card preparation process.

In the aforesaid IC card preparation process, long sheet-shaped first sheet material 1 (being a reverse sheet material) is provided to first sheet material supply section A, while long sheet-shaped second sheet material 2 (being a surface sheet material) is provided to second sheet material supply section B. An adhesive is supplied from adhesive supply section C and coated onto second sheet material 2. The resulting coating is heated in adhesive heating section D and conveyed to inlet supply section E.

Supplied to inlet supply section E, is part inlet 3 comprising IC chips and an IC module including an antenna, which is placed in the specified position of second sheet material 2. The resulting second sheet material 2 is conveyed to back roller section F.

An adhesive is supplied from adhesive supply section G which is applied onto first sheet material 1. The resulting coating is heated in adhesive heating section H and conveyed to back roller section F.

Back roller section F comprises temperature adjustable laminating rollers 4. By utilizing the aforesaid laminating rollers 4, first sheet material 1 is adhered to second sheet material 2. The aforesaid laminating rollers 4 are comprised of paired rollers 4*a* and 4*b*, which exhibit a temperature difference of 0–100° C. Of the paired rollers 4*a* and 4*b*, the temperature of roller 4*b*, which comes into contact with the second sheet material, is lower than that of roller 4*a*. In the present embodiment, the second sheet material forms a surface side sheet comprising an image receiving layer, while the first sheet material forms a reverse side sheet comprising a writing layer.

Heating rollers section I is arranged following aforesaid back rollers section F. After carrying out adhesion employing back roller section F, the resulting material is heated by paired rollers 5*a* and 5*b* of heating rollers section I. As noted above, before adhering first sheet material 1 to second sheet material 2, the sheet material coated with the adhesive layer is heated and then conveyed to caterpillar pressing section J.

Aforesaid back roller section F, heating rollers section I, and caterpillar pressing J are arranged on the same production line as the adhesion process. Caterpillar pressing section J comprises heated pressing section J1 and cooled pressing section J2. After heated pressing, cooled pressing is carried out.

After heated pressing and cooled pressing employing caterpillar pressing section J, the resulting adhered sheet is conveyed to cutting section K. In the aforesaid cutting section K, the adhered sheet is cut into sheets at an optimal size which allows for a plurality of blank IC cards. Sheets, which are prepared by cutting the adhered sheet, are stacked while inserting a metal plate between a specified number of sheets which are then stored.

Thereafter, the sheets are conveyed to die-cutting section L and die-cut into a card shape, whereby a blank card is prepared. Before carrying out die-cutting into cards, format may be printed on either the first sheet material or the second sheet material.

Before carrying out die-cutting into cards, the adhered sheet is cut into larger sheets. By this process, handling is facilitated and the die-cutting accuracy is enhanced. Further, before die-cutting into cards, by printing a format, handling is also facilitated and the accuracy of format printing is enhanced.

Figure 2:
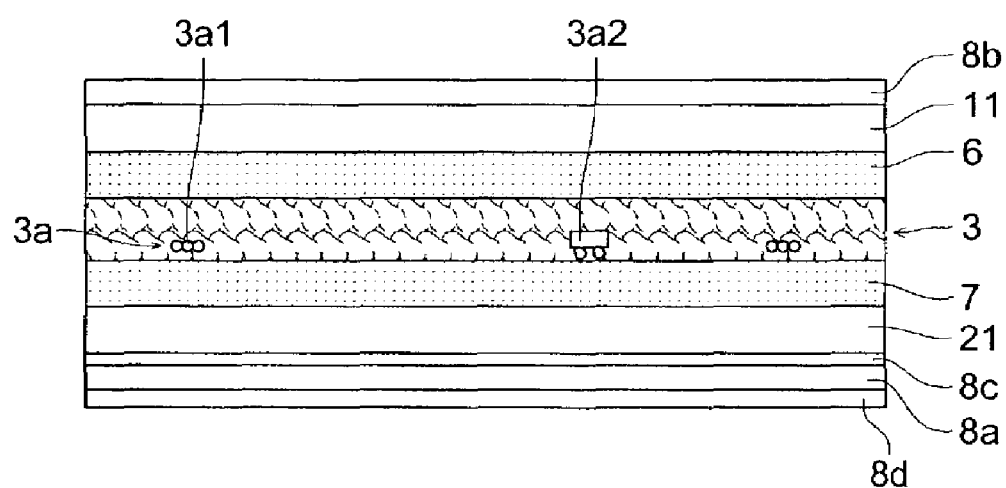
FIG. 2 is a schematic cross-sectional view of an IC card.

FIG. 2 is a schematic cross-sectional view of an IC card.

The aforesaid IC card comprises IC module 3a between substrate 11 comprised of the first sheet material and substrate 12 comprised of the second sheet material. IC module 3a is comprised of electronic parts such as antenna 3a1 and IC chip 3a2, which is provided to IC module 3a inlet 3. Inlet 3 is arranged between the first substrate and the second substrate via adhesive layers 6 and 7.

On at least one side of the aforesaid first or second substrate, provided is image receiving layer 8a, which records personal identification information including name and portrait, employing a thermal transfer system or an ink jet printing system. Cushion layer 8c is provided between image receiving layer 8a and the second substrate. In at least one part of at least one side of the aforesaid first or second substrate provided is writing layer 8b.

A format may be printed on the aforesaid blank IC card before being die-cut into cards.

Further, transparent protective layer 8d is provided on the surface of the image receiving layer recorded with personal identification information including name and portrait. Aforesaid transparent protective layer 8d is compromised of actinic radiation curable resins.

Still further, IC chip 3a2 should not be provided in a position which overlaps the portrait portion. With respect to flatness, unevenness of the peripheral portion of the chip on the surface side of the aforesaid IC card is within ±10 μm. In addition, the aforesaid IC card comprises an IC module comprising IC chips and is a non-contact type.

By employing a card printer which comprises at least one of a printing process, an image transfer process, or a curable foil transfer process, printing or transfer is carried out onto the blank IC card in which an IC module is loaded in the interior of adhesive layers 6 and 7 provided between aforesaid first substrate 11 and second substrate 21.

Figure 3:
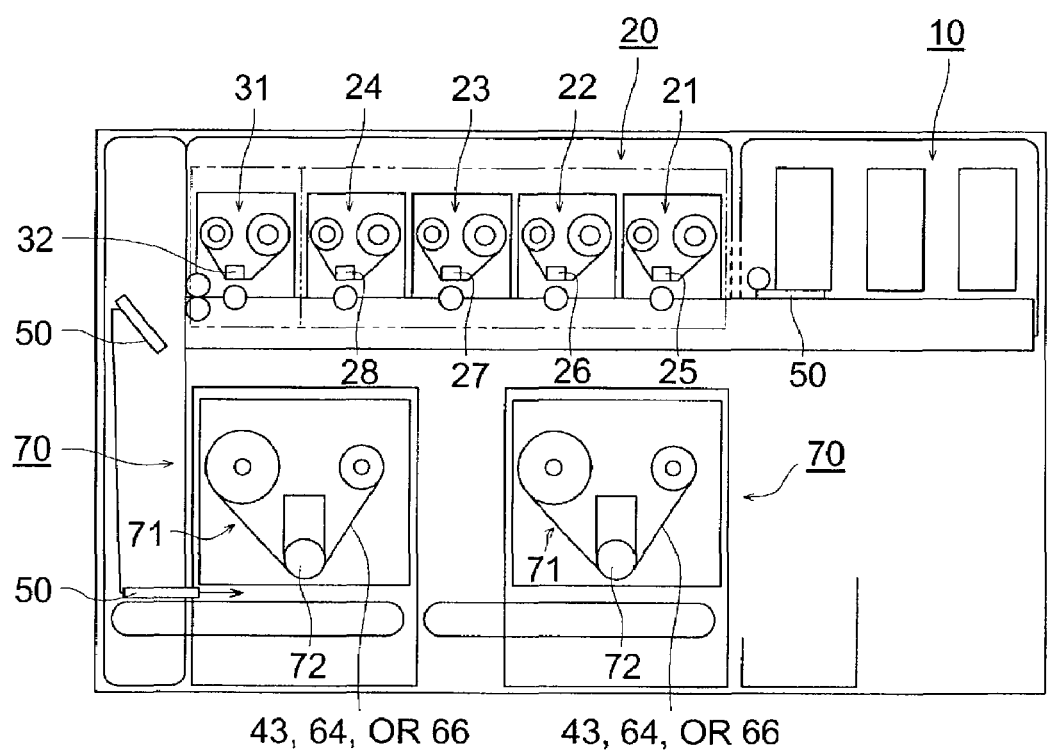
FIG. 3 is a schematic view of the constitution of an IC card preparation apparatus.

FIG. 3 is a schematic view of the constitution of an IC card preparation apparatus (a card printer). In the aforesaid card printer, card-shaped blank IC card supply section 10 and information recording section 20 are arranged in an upper position, while a transparent protective layer and/or an optically variable element transfer layer providing section/or resin layer providing section 70 is arranged in a lower position. In addition, transparent protective layer and/or optically variable element transfer layer providing section/or resin layer providing section 70 is arranged, whereby images are recorded, and an IC card is prepared.

In blank card supply section 10, for example, a plurality of blank cards 50, prepared as shown in FIG. 1, which have been die-cut into cards to write personal information of the card owner, are stored while the surface to capture a portrait faces upward. In this example, aforesaid blank card 50 is provided with an image receiving layer and is automatically supplied one by one from aforesaid blank card supply section 10 at specific time intervals.

In information recording section 20, arranged are yellow ribbon cassette 21, magenta ribbon cassette 22, cyan ribbon cassette 23, and black ribbon cassette 24, while recording heads 26 through 28 are arranged corresponding to each cassette. Gradation bearing images such as the portrait of the card owner and the like, are recorded onto the specified region during movement of card substrate 50, employing thermal transfer utilizing the aforesaid yellow, magenta, cyan, and black ribbons.

Further, text ribbon cassette 31 and recording head 32 are arranged, and certification and identification information such as the name and card issue date is recorded utilizing thermal transfer employing the aforesaid text ribbon.

In aforesaid information recording section 20, gradation information is recorded onto the image receiving layer, while heating the recording head imagewise at 50–500° C. under a pressure of 0.01–0.3 kg/cm$^2$.

In transparent protective layer and/or optically variable element transfer layer providing section/or resin layer providing section 70, arranged is transfer foil cassette 71, while thermal transfer head 72 is arranged corresponding to aforesaid transfer foil cassette 71. Optically variable element transfer foil 43 and/or transparent protective transfer foil 64 and curable type transfer foil 66 are transferred, and an optically variable element transfer layer and/transparent protective transfer layer and a curable type protective layer comprising a transfer layer are arranged.

In the present invention, sheets are adhered employing an adhesive which contains diphenylmethanediisocyanate in an amount of less than 1.0 percent and exhibits an elongation at fracture of 150–1,500 percent after complete curing, and the resulting sheet is die-cut into a card shape, while the elongation at fracture of the aforesaid adhesive is maintained in the range of 5–500 percent.

In the present invention, sheets are adhered employing an adhesive which contains diphenylmethanediisocyanate in an amount of less than 1.0 percent and exhibits an elastic modulus of 15–50 kgf/mm$^2$ after complete curing, and the resulting sheet is die-cut into cards, while the elastic modulus of the aforesaid adhesive is maintained in the range of 5–15 kgf/mm$^2$. By that function, excellent cutting properties as well as desired physical properties (stiffness) of the resulting card are achieved.

Further, in the present invention, an adhesive comprising diphenylmethanediisocyanate in an amount of less than 1.0 percent is used, and the viscosity of the aforesaid additive is 5,000–40,000 cp during coating, resulting in excellent coatability.

Still further, in the present invention, an adhesive is employed which comprises diphenylmethanediisocyanate in an amount of less than 1.0 percent and has a softening point of 50–80° C. By doing so, excellent coatability as well as excellent security is achieved.

Still further, in the present invention, when the elongation at fracture of an adhesive is 300–1,000 percent, cutting is carried out at a blade angle of 20–40 degrees.

Still further, in the present invention, when the elongation at fracture of an adhesive is 5–500 percent, but is more preferably 50–400 percent, cutting is carried out at a blade angle of 80–100 degrees.

Still further, in the present invention, sheet adhesion is carried out at temperature of 20–50° C. and at a humidity of 70–100 percent, achieving excellent physical properties (such as stiffness) of the cards.

Still further, in order to cure the employed adhesive, after adhesion, standing (aging) is carried out at temperature of 20–50° C. and at a humidity of 40–100 percent until cutting. By doing so, desired physical properties (such as stiffness) are achieved.

<Elongation at Fracture of Adhesives>

When an adhesive is continually elongated, it fractures, or breaks at a certain point. The elongation at fracture refers to an elongation ratio of the aforesaid adhesive until the fracture. Generally, when the elongation at fracture is small, cutting is easily carried out employing typical cutting means, such as scissors. On the other hand, a large elongation ratio after fracture results in problems in that cutting with cutting means such as scissors tends to be harder due to the fact that the adhesive elongates more until being cut.

It is preferable to utilize adhesives having a greater elongation ratio after fracture to an IC card substrate so as to result in desired flexibility when the aforesaid IC card is bent or folded.

When cards are cut utilizing a punch and die system, it is ideal that the small elongation at fracture greatly increases after curing is completed. During cutting, the elongation at fracture is preferably in the range of 5–500 percent, but is more preferably in the range of 50–400 percent. After curing is completed, the elongation at fracture is preferably 150–1,500 percent, but is more preferably 250–950 percent.

<Measurement Method of Elongation at Fracture and a 2-Percent Elastic Modulus>

The 2-percent elastic modulus refers to the elastic modulus at an elongation of 2 percent. In the present invention the elongation at fracture and 2-percent elastic modulus are determined as follows. An adhesive is coated at 23° C. and 55 percent relative humidity, and then allowed to stand for at least 300 hours. Subsequently, measurement is carried out employing a Tensilon Universal Tester RTA-100, produced by Orientech Co., Ltd. while simultaneously carrying out data processing, employing a Tensilon Multifunctional Type MP-100/200S Ver. 44. The adhesive is fixed employing an air-chuck system. The crosshead speed is selected from 5 to 100 mm/minute, and RANGE is selected from 5 to 100 percent, while load is selected from 0.1 to 500 kg. In the present invention, evaluation was carried out at a crosshead speed of 30 mm/minute, a RANGE of 20 percent, and a load of 100 kg. Upon measuring the elongation at fracture and 2-percent elastic modulus, a 500 µm thick adhesive layer was formed on a polypropylene sheet for separating and was peeled off to prepare a single layer sample, which was employed for measurement. A 1 cm wide sample was fixed by an air chuck system and a tensile test was carried out. The elongation at fracture was determined based on elongation when the adhesive layer resulted in fracture or cracking during elongation.

<Temperature Control of Back Roller>

Laminating rollers, which adhere the first sheet material onto the second sheet material of the present invention, are fitted with a temperature control mechanism. The temperature of the aforesaid rollers is preferably 40–90° C. The aforesaid temperature control mechanism includes a method in which rollers are electrically heated, a method in which hot air is blown into the interior of the rollers, and a method in which a temperature-controlled liquid is circulated. Of these, the method in which heated water is circulated is preferred due to its simplicity. The aforesaid temperature is more preferably 60–90° C. In addition, in order to minimize a decrease in temperature of the coated adhesive, it is preferable to attach a heating apparatus before the coated adhesive is adhered to the sheet on the facing side. The temperature of the aforesaid heating apparatus is preferably 50–120° C., and is more preferably 60–120° C.

<Ambience during Adhesion>

Generally, even though ambient humidity and temperature are not controlled during adhesion, it is possible to coat an adhesive which is subsequently subjected to progress of curing. However, when moisture curing type adhesives are employed, operation under a temperature and humidity controlled ambience results in a greater curing rate and quicker complete curing.

The aforesaid ambience during adhesion is preferably at a temperature of 20–50° C. and humidity of 70–100 percent.

<Storage Ambience of Sheets After Lamination>

Sheets which are coated with an adhesive and adhered are allowed to stand until the adhesive is cured (aging process). The temperature of the storage ambience of sheets is preferably 20–50° C. in which the adhesive results in no foaming and is subjected to curing, while humidity is preferably 40–100 percent.

When sheets are aged for approximately three days, peeling resistance reaches at least 1,500 g/2.5 cm, resulting in neither deformation nor bending, even though sheets are transported or cut. The adhesive is completely cured over 1–4 weeks thereafter. Employing the means described below, it is possible to enhance the curing rate of the adhesive.

Initial curing is carried out while allowing the sheets to stand for 3–72 hours at a temperature of 10–30° C. and humidity of 20–80 percent. Thereafter, the resulting sheets are allowed to stand at a temperature of 35–50° C. and humidity of 60–100 percent, whereby it is possible to shorten the time for complete curing to approximately one half or less.

<Metal Plates Inserted between Sheets>

A laminated sheet results in unevenness due to the presence of circuits and IC chips in its interior, whereby it is difficult to stack them vertically. When flat stiff metal plates are inserted between a certain number of sheets, it is possible to stack sheets vertically with no deformation. The metal plate inserting interval is preferably 10–400 sheets, and is more preferably 20–200 sheets.

<Load Applied to Sheets>

It is necessary to apply some load to the newly laminated sheets during storage until completion of curing to enhance close contact of the two laminated sheets. Load applied to the sheets is preferably 2–1,500 kg/m².

<Cutting to Card Shape>

In the present invention, in order to cut the sheets to a card shape, a blade of a punch and die system and a hollow blade were employed.

The punch and die system, as described herein, refers to a system in which a metal mold, in which the upper part and the lower part are paired, is employed and the angle of the upper and lower blades is matched at approximately 90 degrees whereby a sheet is cut. The angle of the cutting blade of the punch and die system is preferably 80–100 degrees, and is more preferably 85–95 degrees.

In the hollow blade system, a sheet is die-cut into cards, employing a blade from the upward position. During die-cutting, the angle of the blade is approximately 30 degrees, is preferably 20–40 degrees, and is more preferably 25–35 degrees.

The punch and die system is suitable to die-cut a large number of sheets due to the simple structure of the blade. However, it is difficult to die-cut sheets having high elongation at fracture.

On the other hand, since the hollow blade forms an acute angle, it is possible to die-cut sheets having any elongation at fracture, while it is inferior to the punch and die system in the aspect of durability. Further, since the blade moves obliquely, the image receiving layer as well as the writing layer applied onto the sheet substrate tends to crack. The preferred blade angle is approximately 30 degrees.

<Judgment of Complete Curing>

When the isocyanate group incorporated in adhesives undergoes reaction at a ratio of 90 percent, it is assumed that the aforesaid adhesives have undergone complete curing. Complete curing is confirmed as follows. A prepared sheet is cut into cards and is subjected to a thermal treatment of 90° C. or more. When no expansion due to generation of carbon dioxide is formed, curing is assumed to be completed.

The intermediate reaction process may be checked by quantitatively analyzing the amount of an isocyanate group (an NCO group) based on spectral intensity, while measuring the infrared spectra.

<Viscosity of Adhesives during Coating>

When the viscosity of adhesives during coating is 5,000 or less, many air bubbles are formed during adhesion to prepare IC cards coating to enhance the unevenness of surface. On the other hand, when it exceeds 40,000 mPs, the plane unevenness is enhanced.

Other than the formation of plane unevenness, problems occur in which the resulting card surface strength is degraded after curing. Therefore, the aforesaid viscosity is preferably 7,000–30,000 mPs, and is more preferably 7,000–20,000 mPs.

The coating temperature is preferably 140° C., but is more preferably 130° C.

(Adhesives)

Preferably employed as adhesives to carry out adhesion of the present invention are hot-melt adhesives comprising diphenylmethanediisocyanate and thermoplastic resins. Employed as hot-melt adhesives may be, for examples, those generally employed. Listed as main components of such hot-melt adhesives are, for example, ethylene-vinyl acetate copolymer (EVA) based adhesives, polyester based adhesives, polyamide based adhesives, thermoplastic elastomer based adhesives, and polyolefin based adhesives. In the present invention, low temperature adhesives, specifically moisture curing type adhesives, are preferred.

Examples of moisture curing types reactive hot-melt adhesives are disclosed in Japanese Patent Application Open to Public Inspection Nos. 2000-036026, 2000-211278, 2000-219855, and 2002-175510. Any of these adhesives may be used, if low temperature adhesion can be achieved.

The thickness of the adhesive layer after curing is preferably 100–600 µm, including the IC module, is more preferably 150–500µm, and is still more preferably 150–450 µm.

<Diphenylmethanediisocyanate>

The content of diphenylmethanediisocyanate (MDI) in adhesives is preferably less than one percent.

(IC Module)

The IC module, as described herein, refers specifically to an assembly of electronic parts such as an IC chip which electrically stores information of the bearer of the aforesaid electronic card and a coiled antenna connected to the aforesaid IC chip. The aforesaid IC chip refers to a memory and a microcomputer. In some cases, the aforesaid electronic parts may include capacitors.

The aforesaid IC module comprises an antenna coil. On the other hand, when an IC module comprises an antenna pattern, any electrically conductive paste printing process, copper foil etching process, and winding welding process may be employed. Employed as a printed circuit board is a thermoplastic film such as polyester film. When further heat resistance is demanded, polyimide is advantageously employed.

It is known that the aforesaid IC chip is connected to the aforesaid antenna pattern by a method utilizing electrically conductive adhesives such as copper pastes and carbon pastes (EN-4000 Series available from Hitachi Kasei Kogyo Co. and XAP Series available from Toshiba Chemical Co.), a method utilizing an anisotropic electrically conductive film (Anisolm, produced by Hitachi Kasei Kogyo Co.), or a method in which soldering connection is carried out, but based on specific situations, any of these methods may be employed.

Parts, including IC chips, are placed in specified positions and subsequently resins are filled. As a result, operation stability may occasionally be lost in such a way that some parts are disconnected due to shearing force resulted by resin flow and the surface smoothness is degraded due to resin flow and cooling. To overcome such drawbacks, a resin layer is formed on the substrate sheet of the module and parts are sealed in the aforesaid resinous layer. It is preferable that electronic parts are enveloped in a porous resinous film, a porous foamed resinous film, a flexible resinous sheet, a porous resinous sheet, or a nonwoven fabric and are employed in the form of a sheet-shaped module.

Further, since IC chips exhibit low point pressure strength, it is preferable to provide a reinforcing plate near the IC chip.

The overall thickness of the aforesaid IC module is preferably 10–300 µm, is more preferably 30–300 µm, and is still more preferably 30–250 µm.

"Method to Provide an IC Module Between the First Substrate and the Second Substrate"

In the present invention, in order to provide an IC module between the first substrate and the second substrate, known are a thermal adhesion method, an adhesive adhesion method, and an injection molding method, but adhesion may be carried out employing any of these methods.

Before or after allowing the first substrate to adhere to the second substrate, carried out may be either format printing or information recording. In such cases, employed may be offset printing, gravure printing, silk screen printing, intaglio printing, letterpress printing, ink jet printing systems, a sublimation transfer system, and a thermal fusion system.

In regard to the production method of the blank IC card of the present invention, disclosed are adhesion methods and coating methods in Japanese Patent Application Open to Public Inspection Nos. 2000-036026, 2000-219855, 2000-211278, 10-316959, and 11-5964. Herein, employed may be any of these adhesion methods and coating methods.

<Sheet Member for IC Card>

Listed as substrate materials of the first sheet member and the second sheet member, for example, polyester resins such as polyethylene terephthalate, polybutylene terephthalate, polyethylene terephthalate/isophthalate copolymers; polyolefin resins such as polyethylene, polypropylene, and polymethylpentane; polyethylene fluoride based resins such as polyvinyl fluoride, polyvinylidene fluoride, polyethylene tetrafluoride, and ethylene-ethylene tetrafluoride copolymers; polyamides such as nylon 6 and nylon 6.6; vinyl polymers such as polyvinyl chloride, vinyl chloride/vinyl acetate copolymers, ethylene/vinyl acetate copolymers, ethylene/vinyl alcohol copolymers, polyvinyl alcohol, and vinylon; biodegradable resins such as biodegradable aliphatic polyester, biodegradable polycarbonate, biodegradable polylactic acid, biodegradable polyvinyl alcohol, biodegradable cellulose acetate, and biodegradable polycaprolactone; cellulose based resins such as cellulose triacetate and cellophane; acryl based resins such as methyl polymethacrylate, ethyl polymethacrylate, ethyl acrylate, and butyl polyacrylate; synthetic resin sheets such as polystyrene, polycarbonate, polyallylate, and polyimide; or paper such as fine-quality paper, thin leaf paper, glassine paper, and sulfate paper; and single layer bodies such as metal foils or at least two layer laminated bodies thereof.

The thickness of the supports of the present invention is commonly from 30 to 300 μm, and is preferably from 50 to 200 μm. In the present invention, upon taking into account adverse effects due to the thermal contraction, as well as the curl of the supports on the transportability of card sustrate materials, it is preferable that the thermal contraction ratio in the longitudinal direction (MD) and that in the lateral direction (TD) of said sheet member are preferably at most 1.2 percent and at most 0.5 percent at 150° C./30 minutes, respectively. Further, in order to enhance adhesion during any post treatment, the aforesaid support may be subjected to a simple contact treatment. In addition, in order to protect chips, an antistatic treatment may be performed.

Specifically, it is possible to suitably employ U2 Series, U3 Series, U4 Series, and UL Series, manufactured by Teijin Dupont Film Co., Ltd.; Crisper G Series, manufactured by Toyobo Co., Ltd.; and E00 Series, E20 Series, E22 Series, X20 Series, E40 Series, E60 Series, and QE Series, manufactured by Toray Co., Ltd.

Other than the image receiving layer to record a portrait, a cushion layer may be provided on the ID card substrate of the present invention. An image element is provided on the substrate surface of a personal identification card, and at least one selected from the group consisting of a certification and identification image such as a portrait, an attribute information image, and format printing may be provided. Further, a white card having no printed portion may be acceptable.

(Adhesion)

During adhesion, in order to improve surface smoothness of the substrate and to enhance contact of the IC module provided between the first substrate and the second substrate, it is preferable to apply heat and pressure. Accordingly, it is preferable to carry out production employing an upper and lower press system or a lamination system. Heating temperature is preferably 10–180° C., and is more preferably 30–150° C., while applied pressure is preferably 1.0–300 kgf/cm$^2$, and is more preferably 1.0–200 kgf/cm$^2$. Heating and pressing time is preferably 0.001–90 seconds, and is more preferably 0.001–60 seconds. Further, the reaction rate of the moisture curing type adhesive decreases due to the presence of moisture, namely, adhesion and card durability are degraded. As a result, it is effective to carry out adhesion under vacuum or a nitrogen ambience.

During the adhesion or coating process, a substrate member, an electronic part holding body, and a surface member are adhered to each other under the specified pressure and temperature. Accordingly, when the electronic part holding body itself is comprised of adhesives, it is possible to sufficiently carry out adhesion of the substrate member, the aforesaid electronic part holding body, and the surface substrate at desired reproduction.

The aforesaid first and second substrates are adhered employing adhesives. A sheet for blank IC cards which carries the IC module in the adhesive layer is stored under the specified conditions and subsequently die-cut, whereby IC cards are produced. In such cases, prior to die-cutting, a certification and identification image and bibliographic items may be recorded.

(Thermocurable Resinous Layer)

In the present invention, employed as thermocurable resin compositions, which are employed to prepare the protective layer of the image recording body of the IC card, may be those which are comprised of resins such as epoxy series, polyester series, and acryl series, hardeners, hardening catalysts, flow inducing agents and other additives.

Compositions of polyester resins are preferably comprised of aromatic dicarboxylic acids such as terephthalic acid and isophthalic acid as a main carboxylic acid component, and aliphatic diols such as ethylene glycol and neopentyl glycol as a main diol component. Further, said compositions, which are further comprised of a small amount of aliphatic dicarboxylic acids such as adipic acid and azelaic acid; trivalent or higher valent carboxylic acids such as trimellitic acid, and pyromellitic acid; and trihydric or higher hydric alcohols such as trimethylolethane, trimethylolpropane, and pentaerythritol, are preferred, since the resultant melt fluidity as well as crosslinking ability is enhanced.

Further, the average degree of polymerization of the polyester resins is preferably from 5 to 50. When the average degree of polymerization is less than the lower limit, the resultant cast film does not exhibit sufficient strength, while when it exceeds the upper limit, it is difficult to pulverize the resultant resins. With regard to hardeners, compounds, in which the terminal group of polyester is an —OH type, include isocyanate compounds and melamine resins such as ε-caprolactam block isocyanate and methylated melamine. Compounds, in which the terminal group is a —COOH type, include epoxy resins and triglycidylisocyanurate.

(Method for Forming Thermocurable or Photocurable Resinous Layer)

It is preferable that a thermocurable or photocurable resinous layer be formed on an image recording material, employing a coating method or a transfer foil.

When coating is selected as a method to protect the surface of an image recording material, conventional methods known in the art may be employed, which include, for example, a rotation coating method, a wire bar coating method, a dip coating method, a felt coating method, an air-knife coating method, a spray coating method, an air-spray coating method, a static charge air-spray coating method, a roll coating method, a blade coating method, and a curtain-flow coating method. The coating amount in this case varies depending on the intended use, but is preferably, for example, from 0.05 to 50.00 g/m$^2$ as solids. Incidentally, as the coating amount decreases, the apparent sensitivity increases. However, the film characteristics and chemical resistance of the image forming layer is thereby degraded.

As a method to cure the layer after coating, any method, which generates active electromagnetic waves, may be employed. For example, listed may be lasers, light emitting diodes, xenon flash lamps, halogen lamps, carbon arc lamps, metal halide lamps, tungsten lamps, mercury lamps and non-electrode light sources. Preferably listed as light sources are xenon lamps, halogen lamps, carbon arc lamps, metal halide lamps, tungsten lamps, and mercury lamps. Applied energy during curing may be determined by adjusting the exposure distance, time and intensity, based on the kind of polymerization initiators.

(Thermal Treatment)

Thermal energy can be also provided during curing, and means such as ovens, heat rolls, hot stamps, thermal heads, laser lights, infrared flashes and thermal pens may be suitably selected and utilized. A protective layer comprised of a thermocurable or photocurable resinous layer of the present invention can be formed by preparing, in advance, a transparent protective layer ribbon or a transparent protective foil which has been formed by coating on a heat resistant support such as a polyethylene terephthalate resin film, and then thermally transferring this, for example, by use of a thermal head and a thermal transfer roll.

(Method of Transferring Foil on IC Card)

Transfer foil is transferred by a method, in which gives pressure while heating, employing such as a thermal head, a heat roller, a hot stamp machine and so on.

<Image Receptive Layer Receiving Sublimation or Thermal Diffusion Dye Image Employing Thermal Transfer Recording Method>

It is possible to prepare the image receptive layer comprising the second sheet member, employing binders and various types of additives.

In the image receptive layer of the present invention, gradation information containing images are formed employing the sublimation thermal transfer method, while text information containing images are formed employing either the sublimation thermal transfer method or the fusion thermal transfer method. As a result, desired dyeability for sublimation dyes should result, or desired dyeability for sublimation dyes as well as desired adhesion for wax ink should result. In order to provide such specific properties to the image receptive layer, as described below, it is necessary to select appropriate types of various additives and adjust blending amounts thereof.

Suitably employed as binders for said image receptive layer in the present invention are those used for commonly known sublimation transfer recording image receptive layers. Employed as major binders may be various binders such as vinyl chloride based resins, polyester based resins, polycarbonate based resins, acryl based resins, styrene based resins, polyvinyl acetal based resins, and polyvinyl butyral based resins.

However, provided that there are practical requirements (for example, an issued ID card is required to have a specified thermal resistance) with respect to images formed according to the invention, the kind or combination of binders has to be considered to satisfy the requirements. For instance, if thermal resistance of the images is in question and a thermal resistance at 60° C. and higher is required, binders having a Tg of lower than or equal to 60° C. are preferably used, taking bleeding of sublimation dyes into consideration.

Further, when the image receptive layer is formed, there may be a case in which, if desired, metal ion containing compounds are preferably incorporated. Specifically preferable is the case in which a thermal-transferable compound reacts with the metal ion containing compound to form a chelate.

Metal ions, which compose the metal-ion containing compounds described above, include, for example, divalent or multivalent metals belonging to groups I and group VIII in the Periodic Table. Of these, preferred are Al, Co, Cr, Cu, Fe, Mg, Mn, Mo, Ni, Sn, Ti, and Zn, and of these, particularly preferred are Ni, Cu, Co, Cr, and Zn. Preferable compounds containing these metal ions are inorganic or organic salts of the metals and complexes of those metals.

Examples include complexes, comprising $Ni^{2+}$, $Cu2+$, $Co^{2+}$, $Cr^{2+}$ and $Zn^{2+}$, represented by the General Formula described below:

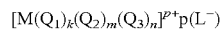

$$[M(Q_1)_k(Q_2)_m(Q_3)_n]^{p+}p(L^-)$$

wherein M represents a metal ion, $Q_1$, $Q_2$, and $Q_3$ each represents a coordination compound which can form a coordination bond with metal ions represented by M, and the coordination compounds may be selected from those described, for example, in "Chelate Kagaku (5) (Chelate Chemistry (5)" (published by Nankoh Do). Particularly preferred examples include coordination compounds having at least one amino group which can form a coordination bond with a metal, and more specifically include ethylenediamine and derivatives thereof, glycineamide and derivatives thereof, and picolineamide and derivatives thereof.

L represents a counter anion which can form complexes, including inorganic compound anions such as Cl, $SO_4$ and $ClO_4$, and organic compound anions such as benzenesulfonic acid derivatives, and alkylsulfonic acid derivatives, and specifically preferable are an anion of tetraphenylboron and derivatives thereof, and an anion of alkylbenzenesulfonic acid and derivatives thereof.

"k" represents an integer of 1, 2 or 3; m represents an integer of 1, 2 or 0; n represents an integer of 1 or 0. However, said integer is determined depending on whether the complex represented by the general formula described above is tetradentate or hexadentate, or depending on the number of ligands of $Q_1$, $Q_2$ and $Q_3$. "p" represents an integer of 1, 2 or 3.

Listed as examples of this kind of metal ion containing compounds may be those exemplified in U.S. Pat. No. 4,987,049. In case of adding the metal ion containing compounds described above, the added amount is preferably 0.5 to 20.0 g/m² with respect to the image receptive layer, and is more preferably 1 to 15 g/m².

Further, releasing agents are preferably added to the image receptive layer. Effective releasing agents are preferably compatible with the binder used, and specifically include modified silicone oil and modified silicone polymers such as amino-modified silicone oil, epoxy-modified silicone oil, polyester-modified silicone oil, acryl-modified silicone resins and urethane-modified silicone resins. Of these, polyester-modified silicone oil is specifically superior in respect to preventing melt adhesion with the ink sheet but not in disturbing ease of secondary processing of an image receptive layer. The ease of secondary processing of an image receptive layer, as described herein, refers to processes such as writability with a felt pen and laminating properties which are required when the images and letters have to be protected. Further, fine particles such as silica are also effective as a releasing agent.

In case the ease of secondary processing is not a problem, curable silicone compounds may be effectively utilized as a prevention means of melt adhesion. UV curable silicone, reaction-curable silicone, etc. are commercially available, and excellent releasing effect can be achieved.

The image receptive layer of the present invention can be manufactured by a coating method in which the image receiving layer coating composition, in which integral components are dissolved or dispersed in a solvent, is prepared, being applied onto the surface of a support described above and subsequently dried.

The thickness of an image receptive layer, formed on the surface of a support, is commonly from 1 to 50 µm, and is preferably from about 2 to 10 µm.

A cushioning layer as well as a barrier layer may be provided between the support and the image receptive layer. When said cushioning layer is provided, it is possible to transfer recording images in accordance with image information so as to result in desired reproduction under minimal noise in the present invention. Listed as materials to compose said cushioning layer are, for example, urethane resins, acryl resins, ethylene based resins, polypropylene based resins, butadiene rubber, epoxy resins, and photocurable resins described in Japanese Patent Publication Open to Public Inspection No. 2002-222403. The thickness of said cushioning layer is commonly from 1 to 50 µm, and is preferably from 3 to 30 µm.

In the present invention, it is possible to provide an information bearing body layer comprised of format printing on the image receptive layer.

The information bearing body comprised of format printing, as described herein, refers to an information bearing body which bears at least one item selected from identification information and text information which have been recorded, and specifically refers to ruled lines, company names, card names, warnings, and the telephone number of a card issuing company.

Further, in order to visually thwart forgery, if desired, water mark printing, holograms, and fine patterns may be available. Appropriately selected as forgery and falsification thwarting layer are printed matters, holograms, bar codes, matted patterns, fine tints, and ground tints and irregular patterns. Said layer may be provided on the front sheet through printing, while employing any of visual light absorbing materials, UV absorbing materials, infrared ray absorbing materials, optical brightening materials, metal evaporated layers, glass evaporated layers, bead layers, optical variable device layers, pearl ink layers, scale-pattern pigment layers, and antistatic layers.

(Cushioning Layer)

Polyolefins are preferably employed as materials to form the cushioning layer of the present invention. Any, which exhibit flexibility analogous to that of the photocurable resinous layer and exhibit low heat conductivity, are suitable, and include, for example, polyethylene, polypropylene, ethylene-vinyl acetate copolymers, ethylene-ethyl acrylate copolymers, styrene-butadiene-styrene block copolymers, styrene-isoprene-styrene block copolymers, styrene-ethylene-butadiene-styrene block copolymers, styrene-hydrogenated isoprene-styrene block copolymers, and polybutadiene.

<Write-Able Layer>

The write-able layer (writing layer) refers to the layer which allows the writing on the rear surface of ID cards. It is possible to form such writing layers by incorporating, in a thermoplastic resin (polyolefins such as polyethylene and various copolymers) film, fine organic powders such as calcium carbonate, talc, diatomaceous earth, titanium oxide, and barium sulfate. It is also possible to from said writing layer, based on "writing-on layer" described in Japanese Patent Publication Open to Public Inspection No. 1-205155. The aforesaid writing layer is formed on the first sheet member, onto which a plurality of layers are not laminated in the support.

(Supports for Transfer Foil)

Listed as materials for supports are, for example, polyester resins such as polyethylene terephthalate, polybutylene terephthalate, and polyethylene terephthalate/isophthalate copolymers; polyolefin resins such as polyethylene, polypropylene, and polymethylpentane; polyfluoroethylene based resins such as polyvinyl fluoride, polyvinylidene fluoride, polytetrafluoroethylene, and ethylene-ethylenetetrafluoride copolymers; polyamides such as nylon 6 and nylon 6.6; vinyl polymers such as polyvinyl chloride, vinyl chloride/vinyl acetate copolymers, ethylene/vinyl acetate copolymers, ethylene/vinyl alcohol copolymers, polyvinyl alcohol, and vinylon; cellulose based resins such as cellulose triacetate and cellophane; acryl based resins such as ethyl polymethacrylate, ethyl polymethacrylate, ethyl polyacrylate and butyl polyacrylate; polystyrene, polycarbonate, polyallylate and polyimide; paper such as wood free paper, thin leaf paper, glassine paper, sulfuric acid paper; and metal foils; and accumulated sheets comprised of two or more layers thereof.

The thickness of supports of the present invention is commonly from 10 to 200 µm, and is preferably from 15 to 80 µm. When the thickness is at most 10 µm, problems occur in which supports are damaged during transfer. In the specified releasing layer of the present invention, polyethylene terephthalate is preferred.

If desired, supports of the present invention may have surface irregularities. Irregularity preparing methods includes compounding of matting agents, sand-blast processing, hair-line processing, matte coating, and chemical etching. In said matte coating, either organic or inorganic substances can be utilized. For example, employed as inorganic substances for matte coating may be silica described in Swiss Patent No. 330,158, glass powder described in French Patent No. 1,296,995, and carbonates of alkaline earth metals or cadmium and zinc described in British Patent No. 1,173,181. Employed as organic substances formatting may be, for example, starch described in U.S. Pat. No. 2,322,037, starch derivatives described in Belgian Patent No. 625,451 and British Patent No. 981,198, polyvinyl alcohol described in Japanese Patent Publication No. 44-3643, polystyrene or polymethacrylate described in Swiss Patent No. 330,158, polyacrylonitrile described in U.S. Pat. No. 3,079,257 and polycarbonate described in U.S. Pat. No. 3,022,169.

The method for attaching a matting agent may be one in which matting agents are dispersed in a coating composition in advance and then coated, or one in which, after applying a coating composition and before complete of drying, matting agents are sprayed. Further, when a plurality of types of matting agents is added, both methods may be employed in combination. When the irregularity surface forming treatment of the present invention is carried out, it can be provided on at least one of the transfer surface as well as the rear surface.

(Transfer Foil Releasing Layer)

Listed as materials employed in said releasing layer are, for example, resins such as acrylic resins having a relatively high glass transition temperature, polyvinyl acetal resins, and polyvinyl butyral resins, waxes, silicone oils, fluorine compounds, and resins such as water-soluble polyvinyl pyrrolidone resins, polyvinyl alcohol resins, Si-modified polyvinyl alcohols, methyl cellulose resins, hydroxy cellulose resins, and silicone resins, paraffin wax, acryl-modified silicone, polyethylene wax and ethylene vinyl acetate, and in addition, polydimethylsiloxane and modified compounds thereof, including oils and resins such as polyester-modified silicone, acryl-modified silicone, urethane-modified silicone, alkyd-modified silicone, epoxy-modified silicone, and polyether-modified silicone and cured compounds thereof. Listed as other fluorine based compounds are fluorinated olefins and perfluorophosphoric acid ester based compounds. Listed as preferable olefin based compounds are dispersions of polyethylene and polypropylene, and long-chained alkyl based compounds such as polyethyleneimine octadecyl. Said releasing agents having low solubility may be employed upon being dispersed.

When two transfer foils are transferred, thermoplastic elastomers may be added.

Listed as specific examples of thermoplastic elastomers are styrene based (styrene block copolymer (SBC)), olefin based (TP), urethane based (TPU), polyester based (TPEE), polyamide based (TPAE), 1,2-polybutadiene based, vinyl chloride based (TPVC), fluorine based, ionomer resins, chlorinated polyethylene, and silicone. Specific compounds are described in "12996 no Kagaku Shoh-hin (12996 Chemical Products)" (Kagaku Kogyo Nippoh Co.).

The thermoplastic elastomers having a tensile elongation of at least 100 percent, used suitably in the invention, which is comprised of a block polymer of polystyrene and polyolefin, refer to thermoplastic resins (hereinafter also referred to as thermoplastic resin S1) comprised of blocks of styrene and saturated straight or branched chain alkyl having at most 10 carbon atoms. Specifically, listed as said thermoplastic elastomers are block polymers, having a polystyrene phase and a hydrogenated polyolefin phase, such as block polymers of styrene-butadiene-styrene (SBS), styrene-isoprene-styrene (SIS), styrene-ethylene/butylene-styrene (SEBS), styrene-ethylene/propylene-styrene (SEPS) and styrene-ethylene/propylene (SEP).

Further, if desired, a thermocurable resinous layer may be used between the releasing layer of the present invention, and the resinous layer or the actinic radiation curable layer. Specifically, listed are polyester resins, acrylic resins, epoxy resins, xylene resins, guanamine resins, diallylphthalate resins, phenol resins, polyimide resins, maleic acid resins, melamine resins, urea resins, polyamide resins, and urethane resins.

A transparent resinous layer of the transfer foil may be comprised while combined with polyvinyl butyral resins, polyurethane resins, polyamide resins, polyester resins, epoxy resins and novolak resins, vinyl monomers such as styrene, paramethylstyrene, methacrylic acid esters and acrylate esters, cellulose series, thermoplastic polyesters, natural resins and any other polymers.

Further, organic polymers known in the art which are described in "Shin Kankohsei Jushi no Jissai Gijutsu (New Practical Technology of Photosensitive Resins)", edited by Kiyoshi Akamatsu (CMC, 1987), and "10188 no Kagaku Shoh-hin (10188 Chemical Products)" pages 657 through 767 (by Kagaku Kogyo Nippoh Co., 1988) may also be used in combination.

In the present invention, it is preferable for the purpose of protecting the surface of the image recording body that a photocurable or thermocurable resinous layer be provided employing a transfer foil. Said photocurable or thermocurable layer is not particularly limited, as long as its materials are comprised of the composition as previously described. The thickness of said transparent resinous layer is preferably from 0.3 to 50.0 µm, is more preferably from 0.3 to 30.0 µm, and is most preferably from 0.3 to 20.0 µm.

The interlayer of the transfer foil is preferably comprised of at least one interlayer. However, if desired, adhesion between layers may be enhanced by additionally providing a primer layer and a barrier layer.

For example, employed may be vinyl chloride based resins, polyester based resins, acryl based resins, polyvinyl acetal based resins, polyvinyl butyral based resins, polyvinyl alcohols, polycarbonates, cellulose based resins, styrene based resins, urethane based resins, amide based resins, urea based resins, epoxy resins, phenoxy resins, polycaprolactone resins, polyacrylonitrile resins, SEBS resins, SEPS resins, and modified compounds thereof.

Of the aforesaid resins, those, which are preferably employed in the present invention, include vinyl chloride based resins, polyester based resins, acryl based resins, polyvinyl butyral based resins, styrene based resins, epoxy resins, urethane based resins, urethane acrylate resins, SEBS resins and SEPS resins. These resins may be employed individually or in combination of at least two types.

Specific compounds are preferably thermoplastic resins comprised of a block polymer of polystyrene and polyolefin, and polyvinyl butyral. Polyvinyl butyral resins having a degree of polymerization of at least 1,000, used in the intermediate layer, which are commercially available, include S-LEK BH-3, BX-1, BX-2, BX-5, BX-55, and BH-S, manufactured by Sekisui Chemical Co., Ltd.), and Denka Butyral #4000-2, #5000-A, and #6000-EP, manufactured by Denki Kagaku Kogyo Kabushiki Kaisha.

The degree of polymerization of polybutyral before thermal curing, as a thermocurable resin in the interlayer, is not limited. Said polybutyral may be resins having a low degree of polymerization. Isocyanate curing agents as well as epoxy curing agents may be employed for thermal curing. Preferable thermal curing conditions are such that the temperature is from 50 to 90° C. and the duration is from 1 to 24 hours. The thickness of said interlayer is preferably from 0.1 to 1.0 µm.

<Thermo-Adhesive Resins>

Listed as thermo-adhesive resins employed in the adhesive layer of the transfer foil are ethylene vinyl acetate resins, ethylene acrylate acid resins, ethylene acrylic acid resins, ionomer resins, polybutadiene resins, acryl resins, polystyrene resins, polyester resins, olefin resins, urethane resins, adhesion providing agent (such as phenol resins, rosin resins, terpene resins, and petroleum resins). Further, copolymers and mixtures thereof may be employed.

Urethane modified ethylene acrylate copolymers, which are specifically available on the market, include Hightech S-6254, S-6254B, and S-3129, produced by Toho Chemical Industry Co., Ltd. Polyacrylic acid ester copolymers, which are available on the market, include JURYMER AT-210, AT-510, and AT-613, produced by Nihon Junyaku Co., Ltd., as well as Plussize L-201, SR102, SR-103, and J-4, produced by GOO Chemical Co., Ltd. The weight ratio of urethane modified ethylene acrylate copolymers to polyacrylic acid ester copolymers is preferably from 9:1 to 2:8, and the thickness of said adhesive layer is preferably from 0.1 to 1.0 µm.

In certain cases, it is possible to provide an optical variable device layer transfer layer to thwart forgery and falsification. The optical variable device (OVD), as described herein, refers to 1) a two-dimensional CG image of diffraction grating such as a kinegram, characterized in that an image composed of a line image varies by free movement by transfer, rotation, expansion, and contraction, 2) a pixelgram characterized in that an image varies between the positive and the negative, 3) an OSD (Optical Security Device) in which color changes from gold to green, 4) an LEDV (Long Lasting Economical Anticopy Device) in which an image is viewed to be different, 5) a stripe type OVD, and 6) a metal foil in which security may be maintained by employing sheet components, specific printing techniques, and specific inks, described in Nihon Insatsu Gakkai Shi (Japanese Printing Association Bulletin), Vol. 35, No. 6, pages 482 through 496 (1998). In the present invention, holograms are particularly preferred.

<Method for Preparing IC Cards>

Listed herein is one example of a method for preparing the IC card of the present invention, which employs a hot melt adhesive. When said IC card is prepared, initially, said hot melt adhesive is applied onto both sides of a sheet, employing an applicator, so as to obtain the specified thickness. Employed as coating methods are common methods such as a roller method, a T die method and a dice method.

In the present invention, stripe-shaped coating is carried out, employing a method in which a T die slit is intermittently opened. However, methods are not limited to the forgoing. Further, irregularity on the surface of the adhesive layer is formed employing a method in which the surface of the adhesive layer coated as above is subjected to a pressing treatment employing an embossing roller. An IC member is placed between the upper and lower sheets which have been coated with said adhesive. Before placement, the coated adhesive may be heated employing a heater. Thereafter, an assembly prepared by placing said IC member between the upper and lower sheets may be pressed for a specified time, employing a press which has been heated to the adhesion temperature of said adhesive. Alternatively, instead of using a press, rolling may be applied to sheets while transported in a thermostat at the specified temperature. Still further, in order to minimize the inclusion of air bubbles during adhesion, a vacuum press may be employed. After adhesion employing the press and the like, the resultant sheets may be subjected to die-cutting to the specified shape or may be cut into cards, whereby cards are prepared.

When reactive adhesives are employed as an adhesive, the resultant sheets are set aside over the specified period for reaction, and then cut into cards. In order to promote hardening, a method is useful in which holes to supply water necessary for the reaction are made in the periphery of the card. In the present invention, when a base material is prepared in a card on size, the following production method is listed. For example, the first sheet material is adhered to the second sheet material via adhesives, and after adhesion, a method is selected in which the laminated sheet base material is molded to the card on size. Mainly selected as the methods to mold on the card size, are a die-cutting method and an ordinary cutting method.

FIG. 2 shows an IC card.

Thickness of the IC card is standardized as 0.76 mm by ISO. The IC card comprises an adhesive layer between two substrates. Writable layers 8b and image receptable layer 8a are provided on one of the surfaces of the substrate which do not have the adhesive layer.

Figure 4:
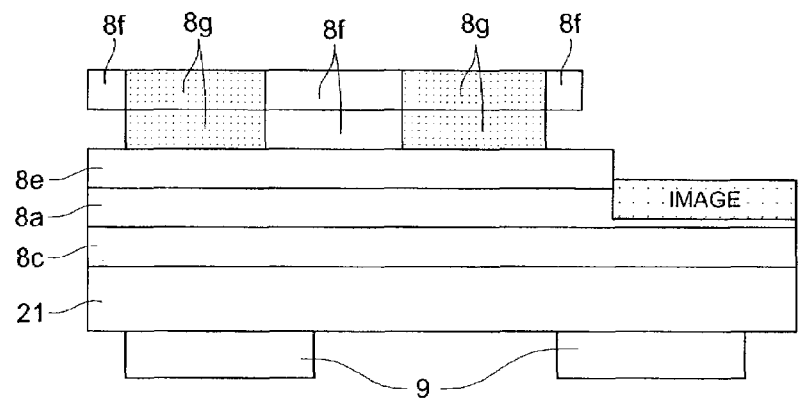
FIGS. 4(*a*) through 4(*c*) show a first embodiment of a front sheet.
Figure 4:
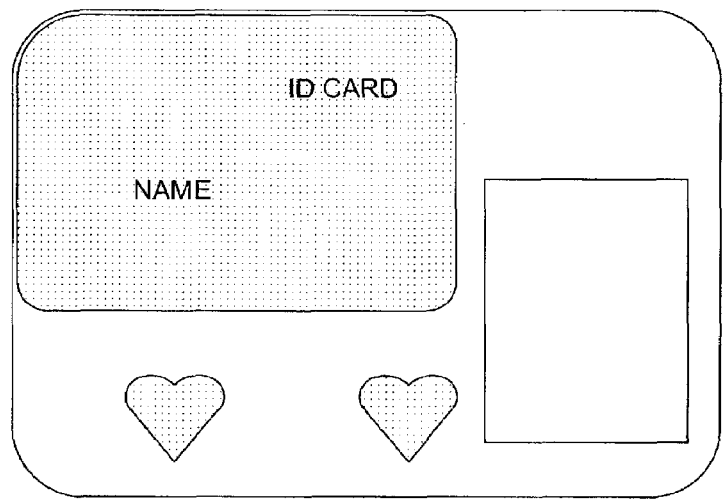
Figure 4:
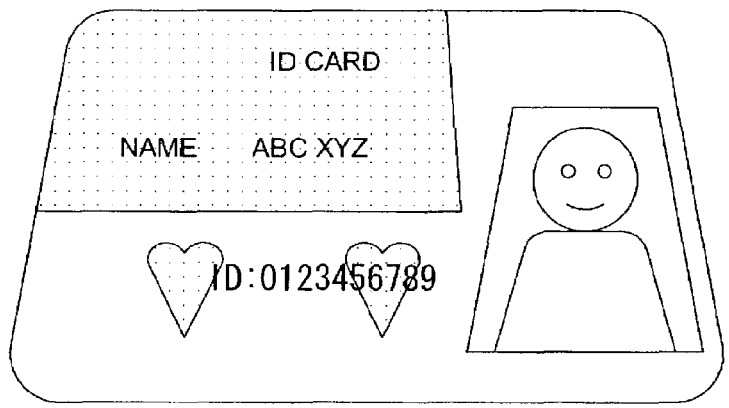
Figure 15:
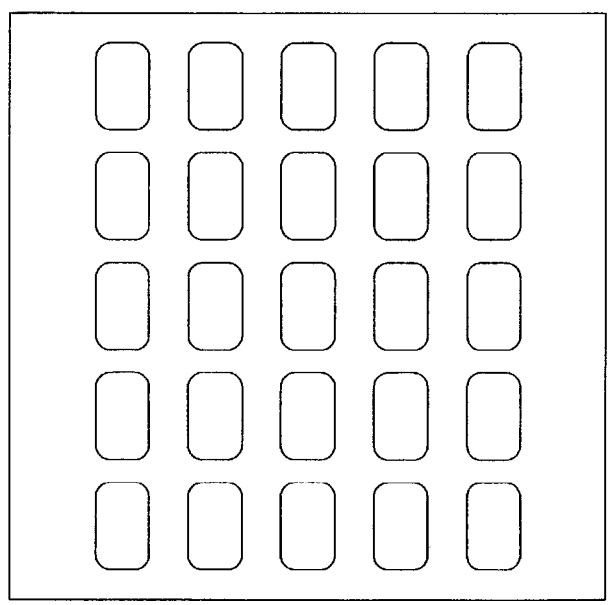
FIG. 15 is a perspective view of a front sheet to prepare a blank.

FIGS. 4(a) through 4(c) show the first embodiment of a front sheet. FIG. 4(a) is a cross-sectional view of said front sheet; FIG. 4(b) is a front view of said front sheet; and FIG. 4(c) is a perspective view showing the constitution of the IC card employing said front sheet. As shown in FIG. 4(a), the card base material of the front sheet comprises a base material having thereon a cushioning layer, an image receptive layer, an information bearing layer, and a transparent resinous layer which are laminated in said order, in which images are formed on said image receptive layer. Two scale-pattern pigment layers are laminated on said information bearing layer, and transparent resinous layers are also laminated thereon. Further, an IC chip hiding part is provided on the side opposite the image receptive layer of the base material. As shown in FIG. 4(b), said information bearing body layer displays employee identification and a name. IC card 9, shown in FIG. 4(c), is prepared employing an IC card base material preparing sheet which consists of a group of said IC cards as shown in FIG. 15.

Figure 5A:
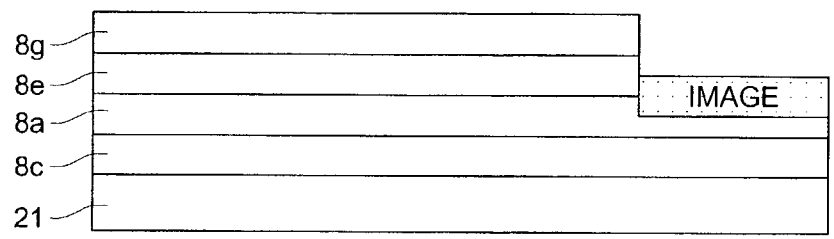
FIGS. 5(*a*) through 5(*c*) show a second embodiment of a front sheet.
Figure 5B:
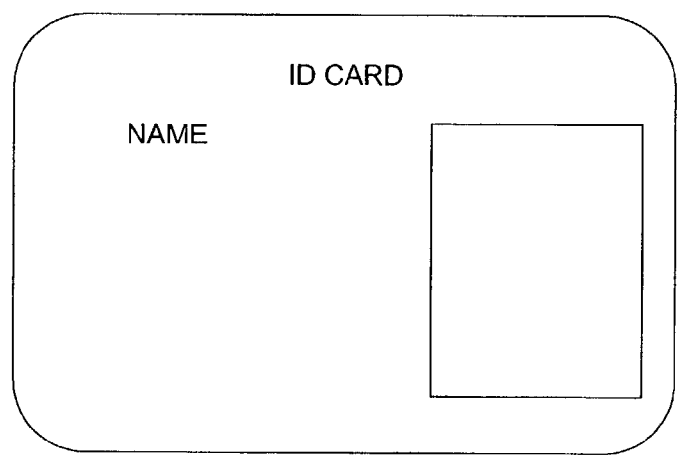
Figure 5C:
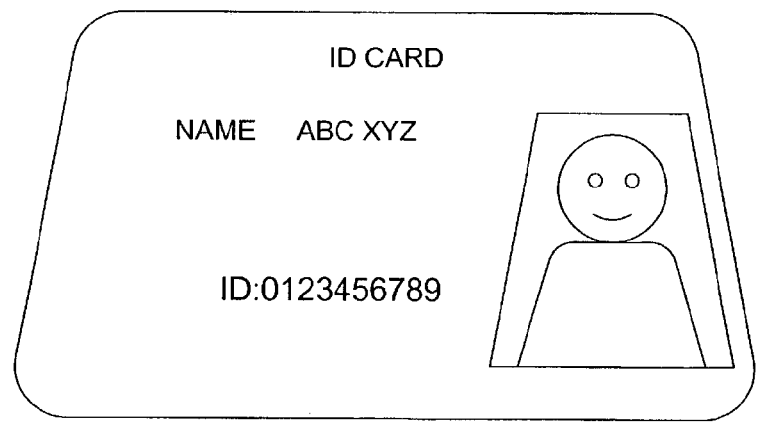

FIGS. 5(a) through 5(c) show the second embodiment of a front sheet. FIG. 5(a) is a cross-sectional view of said front sheet, FIG. 5(b) is a front view of said front sheet, and FIG. 5(c) is a perspective view showing the constitution of the IC card employing said front sheet. As shown in FIG. 5(a), the card base material of the front sheet comprises a base material having thereon a cushioning layer, an image receptive layer, an information bearing layer, and a transparent resinous layer which are laminated in said order, in which images are formed on said image receptive layer. As shown in FIG. 5(b), said information bearing body layer displays employee identification and a name.

Figure 6:
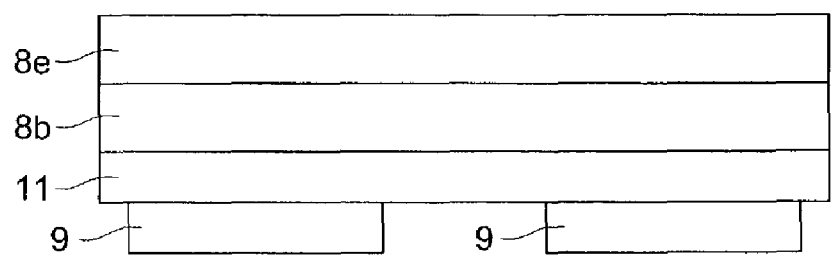
FIGS. 6(*a*) and 6(*b*) show a first embodiment of a rear sheet.
Figure 6:
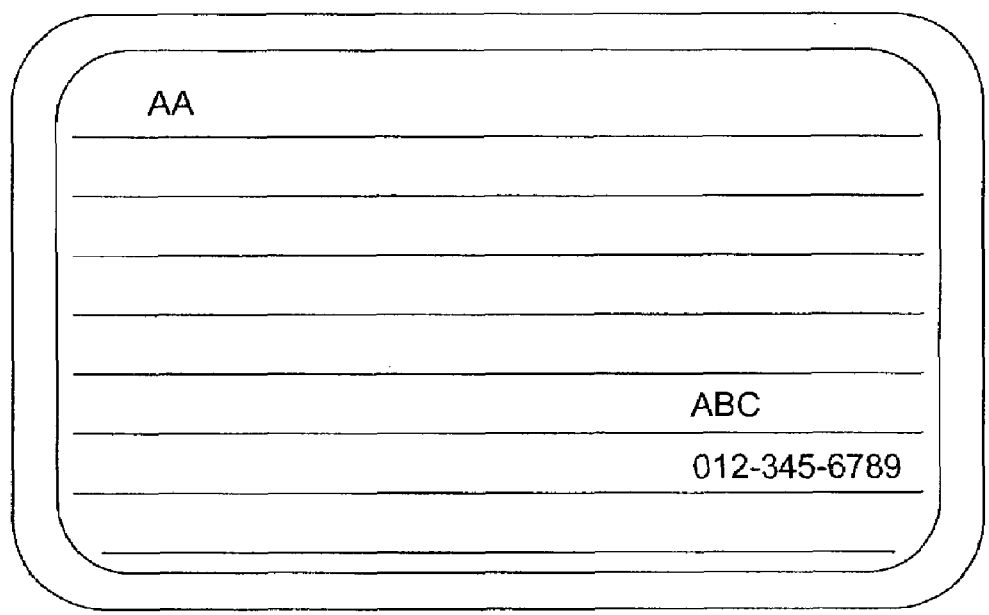

FIGS. 6(a) and 6(b) show the first embodiments of a rear sheet. FIG. 6(a) is a cross-sectional view of said rear sheet, and FIG. 6(b) is a front surface view of said rear sheet. As shown in FIG. 6(a), the card base material of said rear sheet comprises a base material having thereon a writing layer and an information bearing body layer, which are laminated in said order. Further, an IC chip hiding part is provided on the opposite side of the writing layer of the base material.

Figure 16:
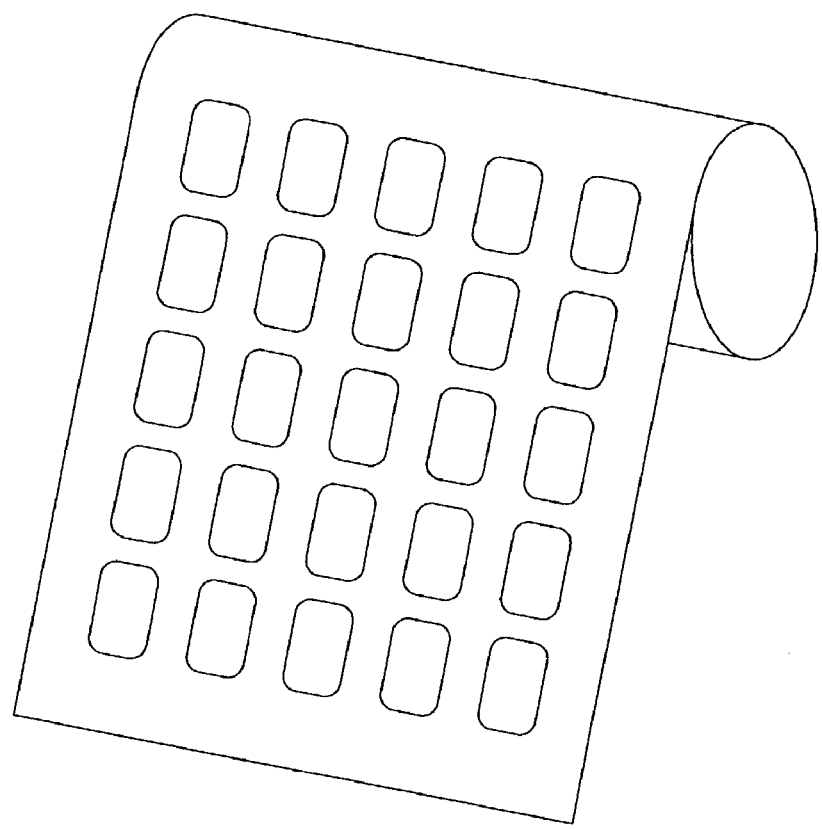
FIG. 16 is a perspective view of a rear sheet to prepare a blank.

As shown in FIG. 6(b), the information bearing body on said writing layer expresses ruled lines, the name of a card issuing company, and remarks. IC cards are prepared employing an IC card base material preparing sheet which consists of a group of said IC cards as shown in FIG. 16.

Figure 7:
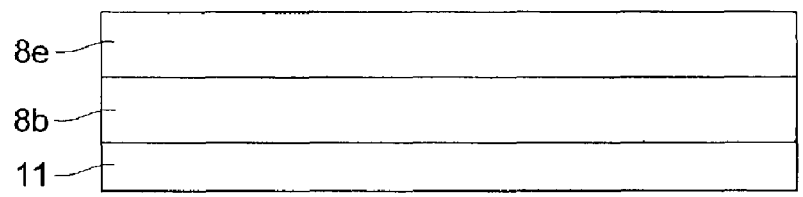
FIGS. 7(*a*) and 7(*b*) show a second embodiment of a rear sheet.
Figure 7:
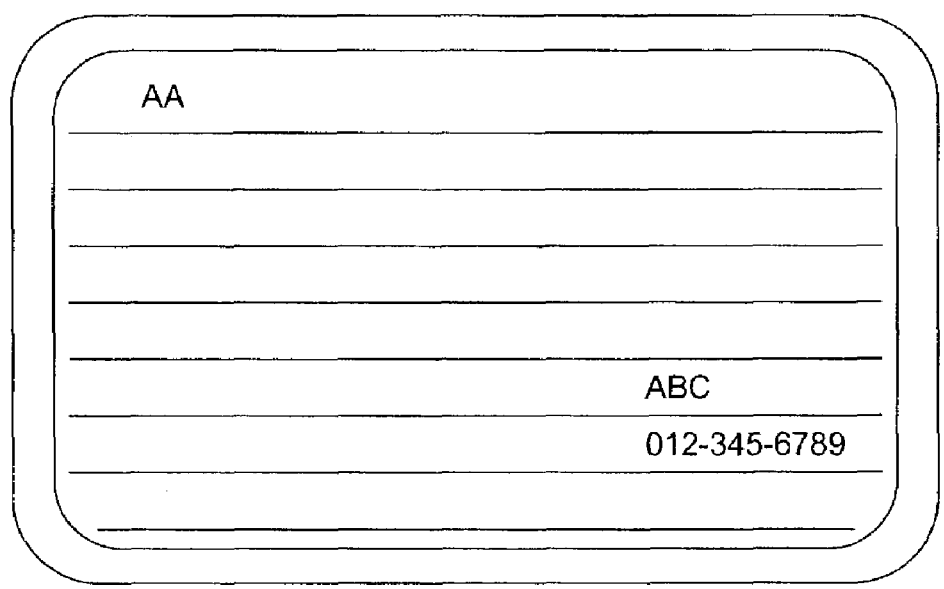

FIGS. 7(a) and 7(b) show the second embodiment of a rear sheet. FIG. 7(a) is a cross-sectional view of said rear sheet, and FIG. 7(b) is a front surface view of said rear sheet. As shown in FIG. 7(a), the card base material of said rear sheet comprises a base material having thereon a writing layer and an information bearing body layer, which are laminated in said order. As shown in FIG. 7(b), the information bearing body on said writing layer displays ruled lines, a card issuing company, the name of the card issuing company, and remarks. IC cards are prepared employing an IC card base material preparing sheet which consists of a group of said IC cards as shown in FIG. 16.

Figure 8:
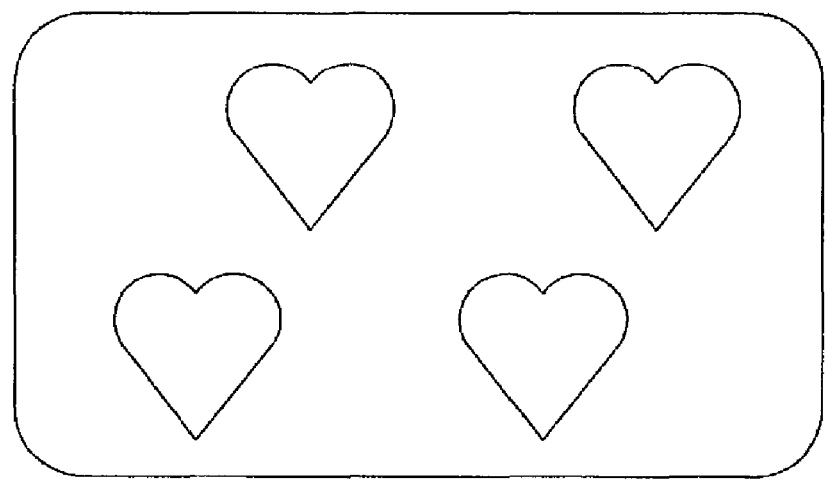
FIG. 8 is a view showing a print pattern on an IC chip shielding layer.
Figure 9:
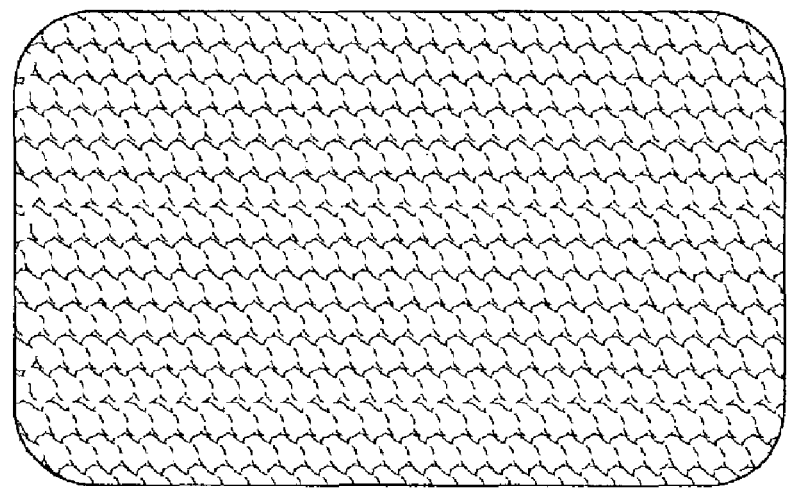
FIG. 9 is a view showing a print pattern on an IC chip shielding layer.

FIGS. 8 and 9 each show a print pattern on a covering layer. The print pattern is provided on the surface sheet substrate by printing, and is also provided on the reverse sheet substrate employing printing.

Figure 10:
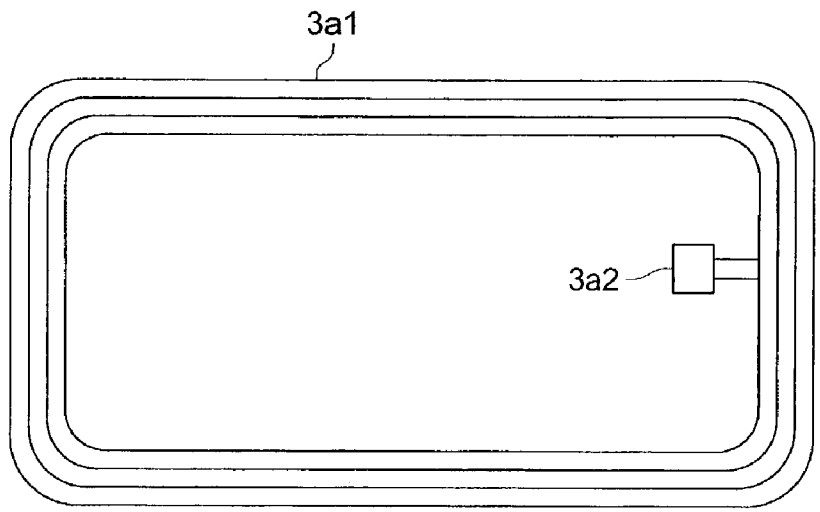
FIG. 10 is a schematic view of an IC module of an IC card.

FIG. 10 is a schematic view of an IC module which is a material for an IC card. In aforesaid IC module, IC chip 3a2 is connected to antenna 3a1 which is comprised of a copper-wound antenna coil.

Figure 11:
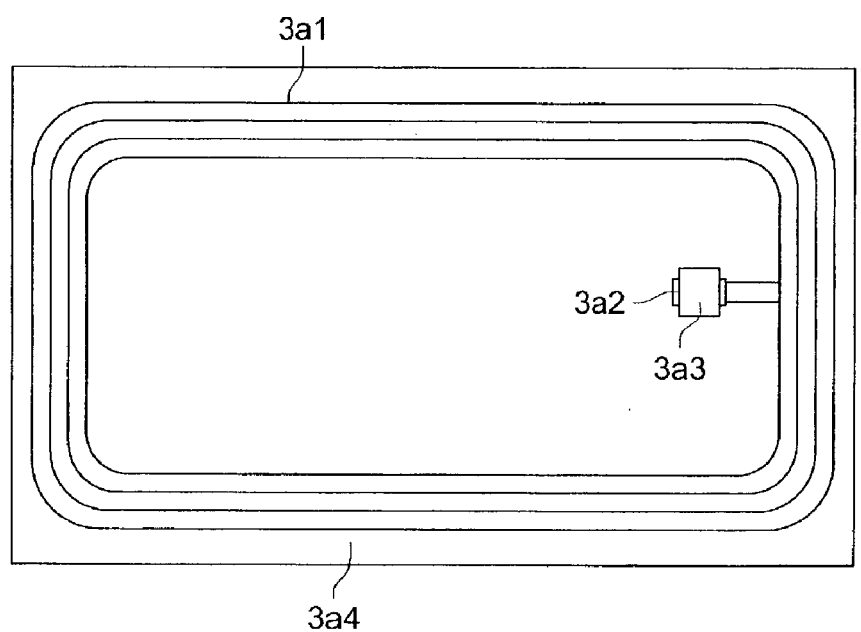
FIG. 11 is a schematic view of an IC fixing layer.
Figure 13:
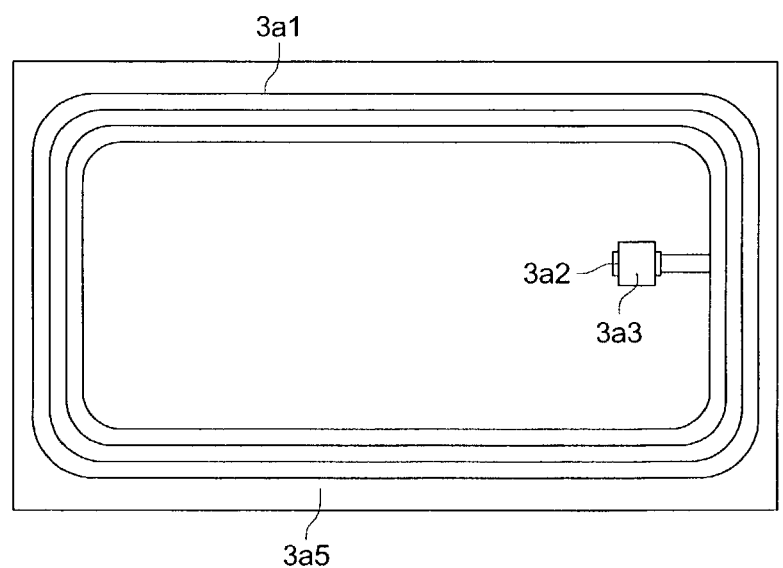
FIG. 13 is a cross-sectional view showing the structure of an inlet.

FIG. 11 shows an example of an inlet comprising an IC module. The aforesaid inlet is an unwoven fabric type. As schematically shown in FIG. 13, unwoven fabric 3a4, which is subjected to formation of a print pattern, is connected to IC chip 3a2 by bodying and reinforcing plate 3a3 which is provided to IC chip 3a2 to cover at least 50 percent of IC chip 3a2. It is possible to use an IC card sheet "FT Series", produced by Hitachi Maxell Co., Ltd.

Figure 12:
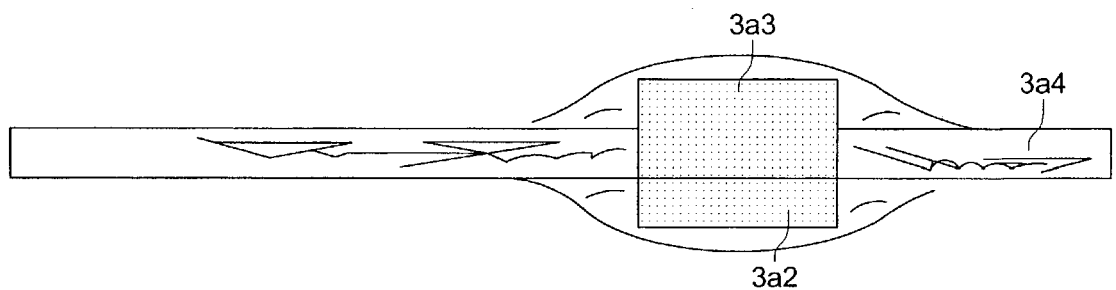
FIG. 12 is a schematic view of an IC fixing layer.
Figure 14:
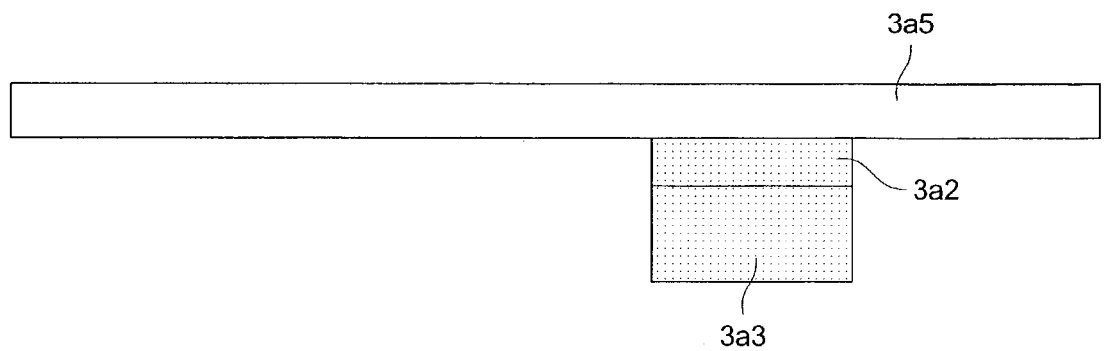
FIG. 14 is a cross-sectional view showing the structure of another inlet.

FIG. 12 is a schematic view of a printed circuit board type inlet in which, as shown in FIG. 14, printed circuit board 3a5, which is subjected to formation of a print pattern is connected to IC chip 3a2 and reinforcing plate 3a3 is provided to IC chip 3a2 to cover at least 50 percent of IC chip 3a2.

FIG. 15 is a perspective view of a front sheet, while FIG. 16 is a perspective view of a back sheet.

Figure 17:
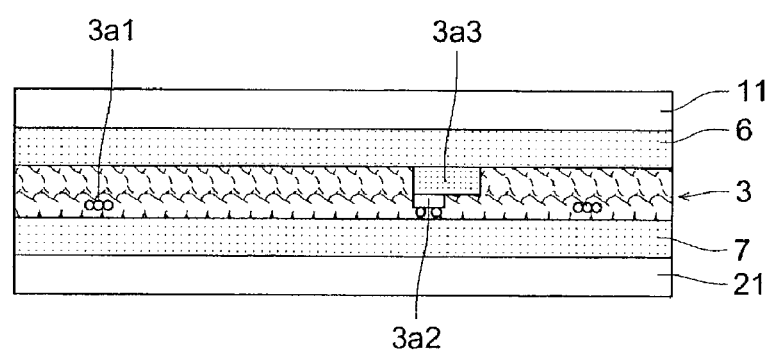
FIG. 17 is a cross-sectional view of a blank IC card.
Figure 18:
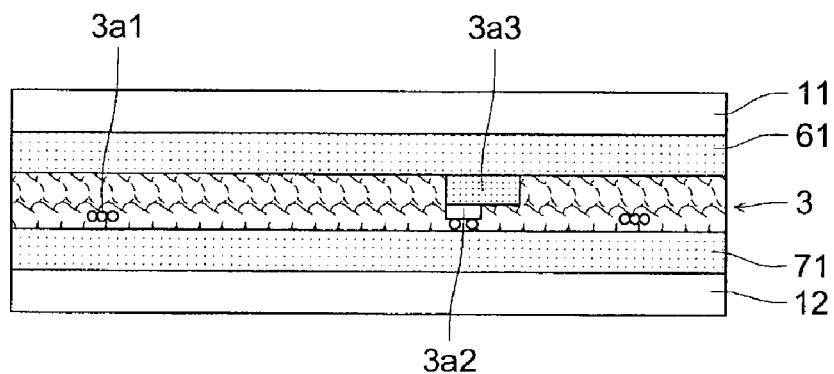
FIG. 18 is a cross-sectional view of a blank IC card.

FIGS. 17 and 18 each is a schematic cross-sectional view of a blank IC card. FIG. 17 shows a blank IC card comprising second substrate 21 having thereon adhesive layer 7, inlet 3, adhesive layer 6, and first substrate 11 in the stated order.

FIG. 18 shows a blank IC card comprising second substrate 21 having thereon adhesive layer 7 comprising tabular particles, inlet 3, adhesive layer 6 comprising tabular particles, and first substrate 11 in the stated order.

Figure 19:
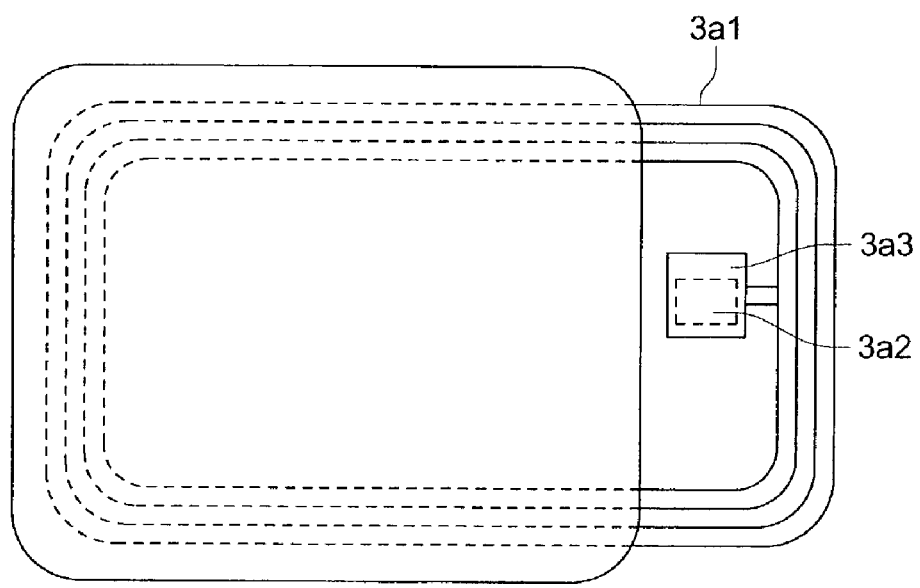
FIGS. 19–22 are plan views showing an arrangement of parts.
Figure 20:
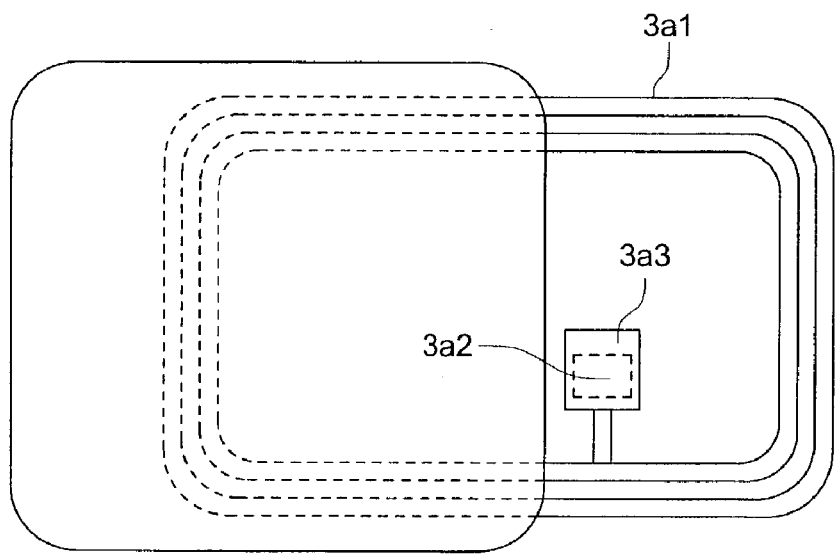

FIGS. 19 through 22 each shows a plan view of a finished IC card. The inlet of each of the IC cards, shown in FIGS. 19 and 20, is structured to comprise reinforcing plate 3a3 near IC chip 3a2 and have a different connecting position to antenna 3a1.

Figure 21:
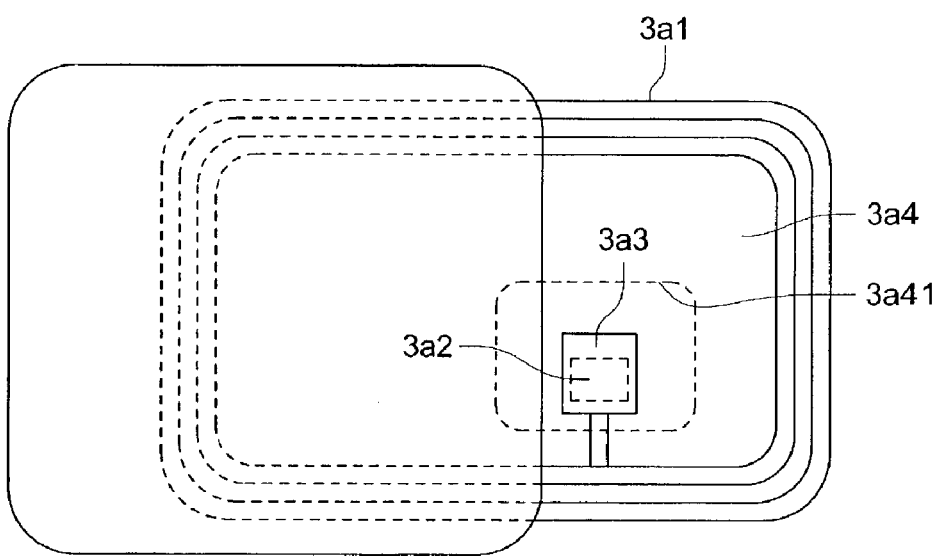

The inlet of the IC card shown in FIG. 21 is structured to have a reinforcing plate near IC chip 3a2 and to have the same connection position with antenna 3a1 as in FIG. 20, while the IC module is interposed by unwoven fabric 3a4 which is a two-dimensionally net-structured mesh sheet having an opening 3a41 in a net state and is inserted.

Figure 22:
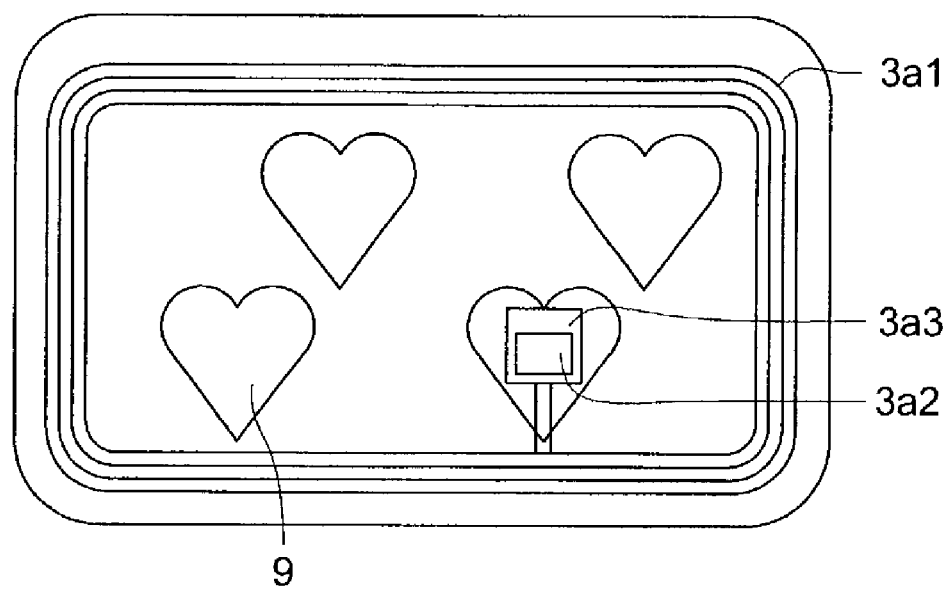

In the IC card shown in FIG. 22, a print pattern on a covering layer, shown in FIG. 8, is employed, and IC chip 3a2 and reinforcing plate 3a3 are covered by the aforesaid covering layer.

In the present invention, the adhered product is cut into sheets in cutting section K, shown in FIG. 1. The resulting sheet is conveyed to die-cutting section L and is then die-cut into cards, which are conveyed to a card printer shown in FIG. 3 and are subjected to printing and transfer.

(Die-Cutting)

Figure 23:
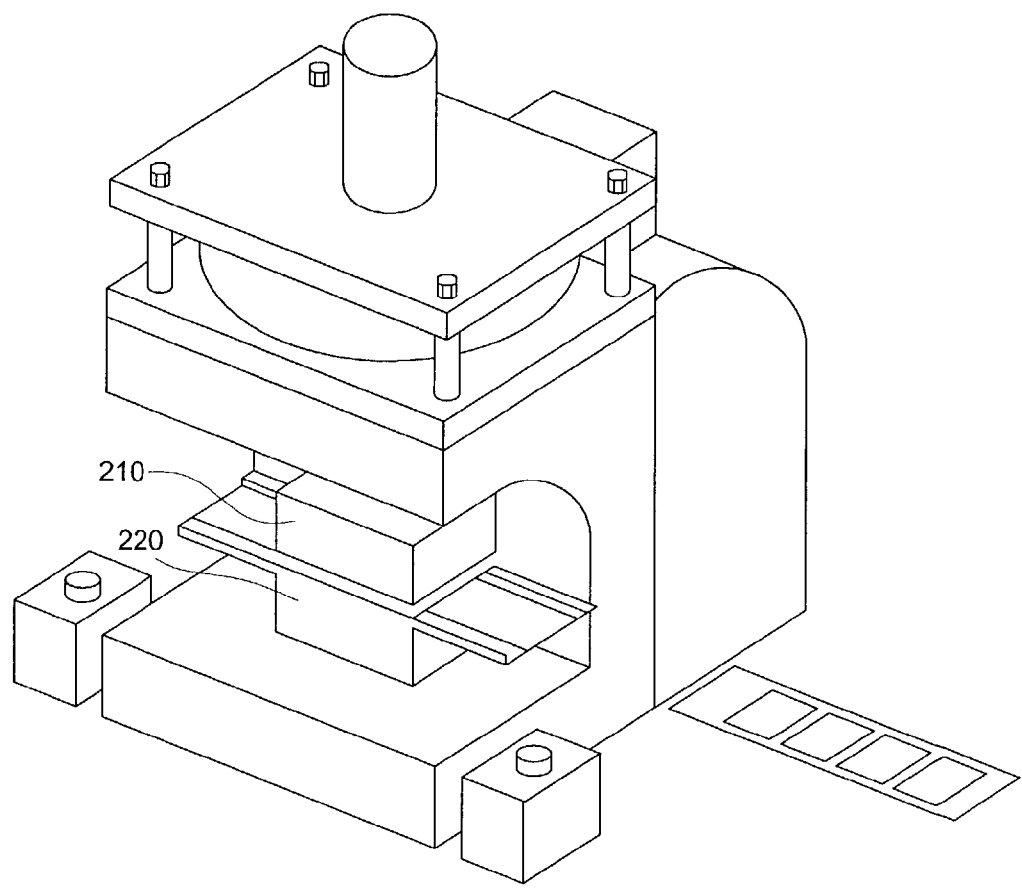
FIG. 23 is a schematic perspective view showing the entire constitution of a die-cutting apparatus.
Figure 24:
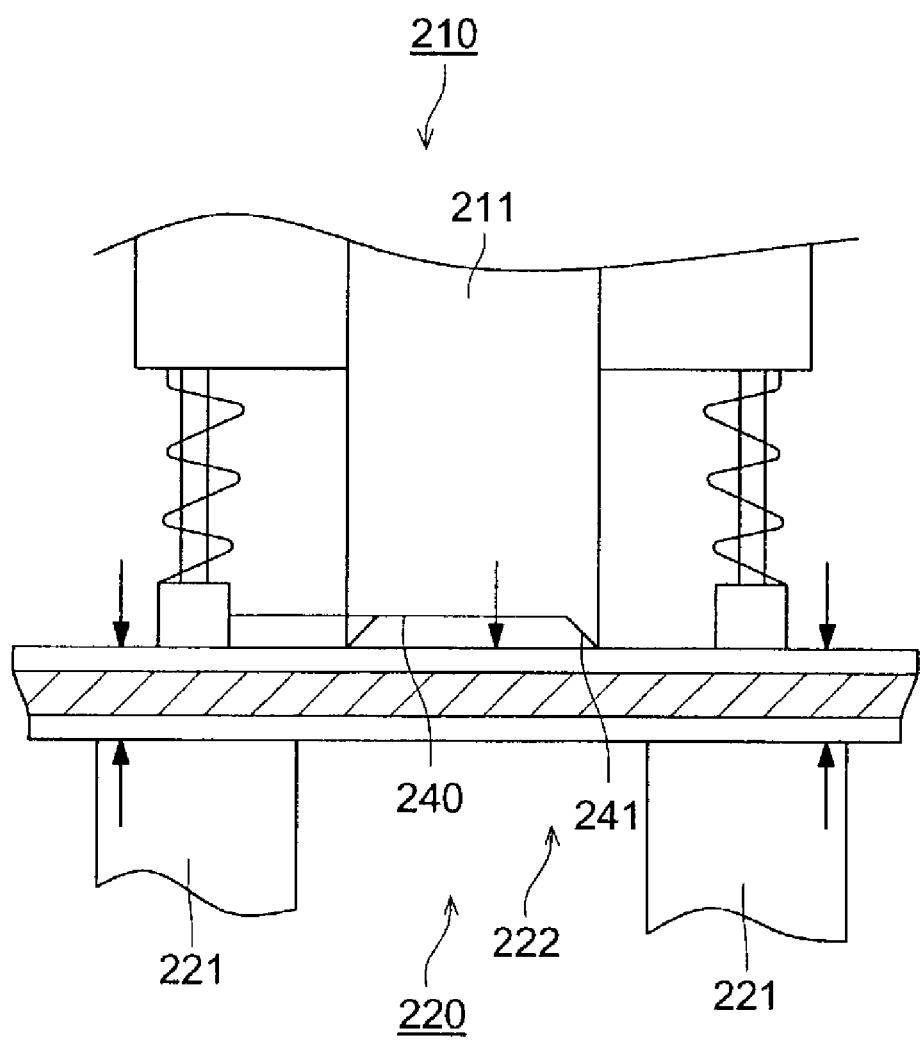
FIG. 24 is a front end view of a main part of the die-cutting apparatus.

FIG. 23 is a schematic perspective view showing the entire constitution of a die-cutting apparatus, while FIG. 24 is a front end view of the main part of the die-cutting apparatus. The aforesaid die-cutting apparatus has a cutting die comprising upper blade 210 and lower blade 220. Upper blade 210 escapes to the inner side of the outer extension and includes a die-cutting punch in which 241 is provided, while lower blade 220 comprises cutting die 221. By allowing die-cutting punch 211 to descend into die opening 222 provided at the center of cutting die 222, IC cards having the same size as die opening 222 are die-cut. Further, in order to achieve the above operation, the size of die-cutting punch 211 is slightly less than that of die opening 222.

EXAMPLES

The present invention will now be detailed with reference to examples. In the examples described below, "part(s)" are "part(s) by weight".

Example 1

<Preparation of Adhesives>

Adhesives described below in the market were employed;
1. MACROPLAST QR3460 manufactured by HENKEL CORPORATION (MDI Content of 3.1%)
2. MACROPLAST QR5110 manufactured by HENKEL CORPORATION CORPORATION (MDI Content of 0.9%), and
3. MACROPLAST MK-014 manufactured by HENKEL CORPORATION CORPORATION (MDI Content of 0.9%).

The following adhesives were employed in addition.

Adhesives 1 Through 4

MACROPLAST MK-014 manufactured by HENKEL CORPORATION (MDI Content of 0.9%) 95 parts Porous high content silica aluminosilicate (AMT-SILICA #200B, manufactured by Mizusawa Industrial Chemicals, Ltd.) Amount is shown below.

|  | Parts | Softening point of the adhesive |
|---|---|---|
| Adhesive 1 | 13 | 58° C. |
| Adhesive 2 | 18 | 59° C. |
| Adhesive 3 | 22 | 60° C. |
| Adhesive 4 | 40 | 60° C. |

The above component was mixed by a homogenizer at 180° C. for 60 minutes to prepare Adhesives 1 through 4.

<Preparation of Second Sheet Member (Rear Sheet)>

Employed as a rear sheet material was 188 μm thickness low heat absorptive U2L98W, manufactured by Teijin Dupont Film Co., Ltd.

(Preparation of Writing Layer)

A first writing layer forming coating composition, a second writing layer forming coating composition, and a third writing layer forming coating composition having compositions described below were applied onto the rear sheet material in said order and subsequently dried. The coating thickness of the resultant writing layer was adjusted to 5 μm, 15 μm, and 0.2 μm, respectively.

<First Writing Layer Forming Coating Composition>

| Polyester resin (VYLON 200, manufactured by Toyobo Co., Ltd.) | 8 parts |
|---|---|
| Isocyanate (Coronate HX, manufactured by Nippon Polyurethane Industry Co., Ltd.) | 1 part |
| Carbon black | minute amount |
| Titanium dioxide particles (CR80, manufactured by Ishihara Sangyo Co., Ltd.) | 1 part |
| Methyl ethyl ketone | 80 parts |
| Butyl acetate | 10 parts |

<Second Writing Layer Forming Coating Composition>

| Polyester resin (VYLONAL MD1200, manufactured by Toyobo Co., Ltd.) | 4 parts |
|---|---|
| Silica | 5 parts |
| Titanium dioxide particles (CR80, manufactured by Ishihara Sangyo Co., Ltd.) | 1 part |
| Water | 90 parts |

<Third Writing Layer Forming Coating Composition>

| Polyamide resin (SUNMIDE 55, manufactured by Sanwa Chemical Industry Co., Ltd.) | 5 parts |
|---|---|
| Methanol | 95 parts |

The center line mean roughness of the resultant writing layer was 1.34 μm.

(Formation of a Format Printing Layer onto the Writing Layer)

Format printing (ruled lines, name of a card issuing company, and telephone number of the card issuing company) was carried out by an offset printing method. Employed as printing ink was a UV black ink. During printing, UV exposure was carried out employing a high pressure mercury lamp at an intensity equivalent to 200 mJ.

(Preparation of IC Chip Hiding Part)

The outermost surface of the support on the opposite side of the writing layer was subjected to water-mark printing employing a resin relief printing method. The printed pattern shown in either FIGS. 8 or 9 was employed. Printing was carried out employing UV black ink. During printing, UV exposure was carried out employing a high pressure mercury lamp at an intensity equivalent to 200 mJ. The layer thickness was 1.0 μm.

<Preparation of Second Sheet Member (Front Sheet)>

Employed as a front sheet material was 188 μm low heat absorptive U2L98W, manufactured by Teijin Dupont Film Co., Ltd.

(Preparation of Front Sheet)

A cushioning layer and an image receptive layer comprised of the compositions described below were successively applied onto the front sheet material and subsequently dried, whereby a second sheet member (Front Sheet Substrate) was formed.

| (Photocurable Cushioning Layer) Layer thickness of 10 μm | |
|---|---|
| Urethane acrylate oligomer (NK OLIGO UA512, manufactured by Shin-Nakamura Chemical Co., Ltd.) | 55 parts |
| Polyester acrylate (ARONIX M6200, manufactured by Toagosei Co. Ltd.) | 15 parts |
| Urethane acrylate oligomer (NK OLIGO UA4000, manufactured by Shin-Nakamura Chemical Kagaku Co.) | 25 parts |
| Hydoxycyclohexyl phenyl ketone (IRGACURE 184, manufactured by Ciba Specialty Chemicals) | 5 parts |
| Methyl ethyl ketone | 100 parts |

After coating, the actinic radiation curable compounds were dried at 90° C. for 30 seconds and were subjected to photocuring, employing a mercury lamp (300 mJ/cm²).

(Image Receptive Layer)

A first image receptive layer forming coating composition, a second image receptive layer forming coating composition, and a third image receptive layer forming coating composition were successively applied onto the aforesaid cushioning layer in said order, and dried. The multilayer coating was carried out to obtain a coating thickness of 0.2 μm, 2.5 μm, and 0.5 μm, respectively, and an image receptive layer was formed.

<First Image Receptive Layer Forming Coating Composition>

| | |
|---|---|
| Polyvinyl butyral resin (S-LEK BL-1, manufactured by Sekisui Chemical Co., Ltd.) | 9 parts |
| Isocyanate (Coronate HX, manufactured by Nippon Polyurethane Industry Co., Ltd.) | 1 part |
| Methyl ethyl ketone | 80 parts |
| Butyl acetate | 10 parts |

<Second Image Receptive Layer Forming Coating Composition>

| | |
|---|---|
| Polyvinyl butyral resin (5-LEK BX-1, manufactured by Sekisui Chemical Co., Ltd.) | 6 parts |
| Metal ion containing compound (Compound MS) | 4 parts |
| Methyl ethyl ketone | 30 parts |
| Butyl acetate | 10 parts |

Compound MS

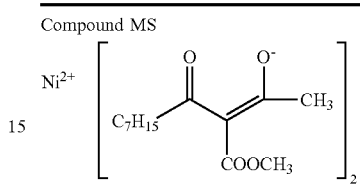

<Third Image Receptive Layer Forming Coating Composition>

| | |
|---|---|
| Polyethylene wax (Hightech E1000, manufactured by Toho Chemical Industry Co., Ltd.) | 2 parts |
| Urethane modified ethylene acrylic acid copolymer (Hightech S6254, manufactured by Toho Kagaku Kogyo Co., Ltd.) | 8 parts |
| Methyl cellulose (SM15, Manufactured by Shin-Etsu Kagaku Kogyo Co., Ltd.) | 0.1 part |
| Water | 90 parts |

(Formation of Information Bearing Body Comprised of a Format Printing Layer)

Format printing (employee identification and name) was carried out on the image receptive layer employing an offset printing method. Employed as printing ink was a UV black ink. During printing, UV exposure was carried out employing a high pressure mercury lamp at an intensity equivalent to 200 mJ.

(Formation of Transparent Resinous Layer)

The composition described below was mixed employing a roller mill, whereby printing ink was prepared. Printing was carried out employing an offset printing method. During printing, UV exposure was carried out employing a high pressure mercury lamp at an intensity equivalent to 200 mJ.

(Transparent Resinous Layer Composition 1)

| | |
|---|---|
| Urethane acrylate oligomer | 50 parts |
| Aliphatic polyester acrylate oligomer | 35 parts |
| DILOCURE 1173 manufactured by Ciba Specialty Chemicals Co.) | 5 parts |
| Trimethylolpropane acrylate | 10 parts |

(Preparation of IC Chip Hiding Part)

The outermost surface of opposite side of the image receptive layer was subjected to water-mark printing employing a resin relief printing method. The printed pattern shown in either FIGS. 8 or 9 was employed. Printing was carried out employing a UV black ink. During printing, UV exposure was carried out employing a high pressure mercury lamp at an intensity equivalent to 200 mJ. The layer thickness was 1.0 μm.

<Preparation of the Image Recording Body for an IC Card>

The first sheet material (being the reverse side sheet) and the second sheet material (being the surface side sheet), prepared as above, are employed. While using the apparatus to prepare blank IC cards as well as blank IC cards with an image receiving layer, shown in FIGS. 23 or 24, the aforesaid first sheet material (being the reverse side sheet) is provided in the first sheet supply section and the second sheet material (being the surface side sheet) is provided in the second sheet material supply section.

Figure 25:
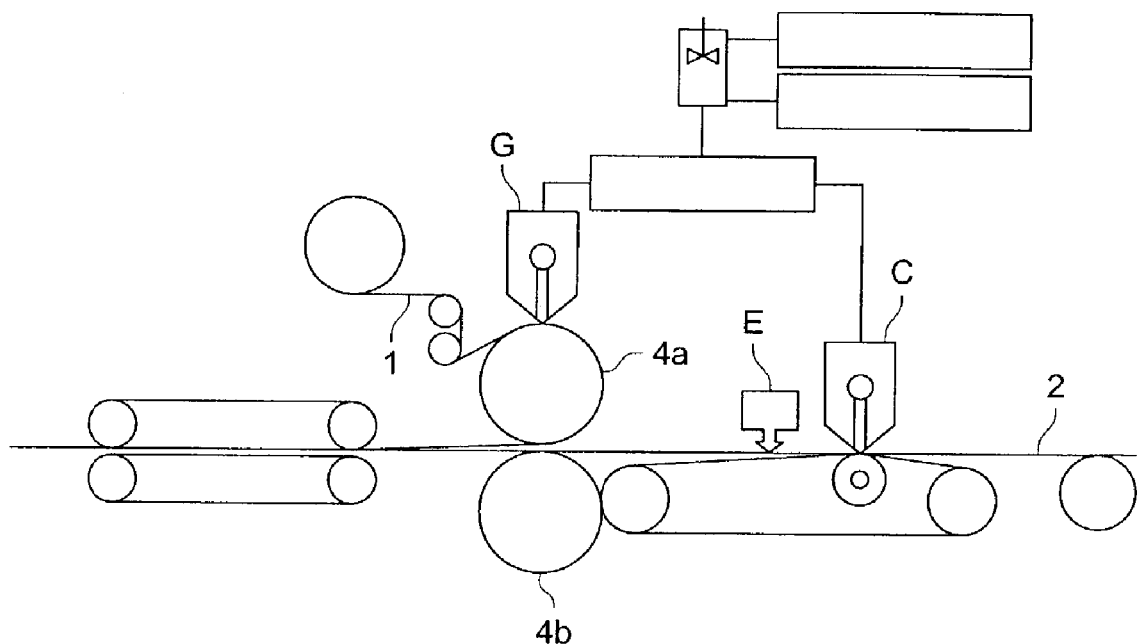
FIG. 25 is a schematic view showing the structure of a blank IC card preparation apparatus.
Figure 26:
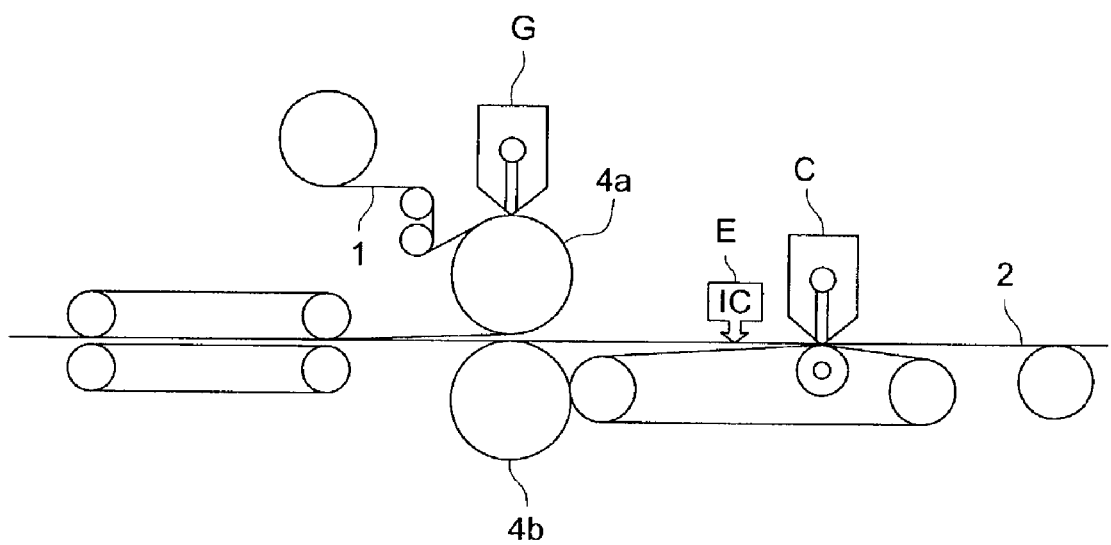
FIG. 26 is a schematic view showing the structure of a blank IC card preparation apparatus.

The embodiments of preparation of blank IC cards will now be described. In the apparatus to prepare blank IC cards in FIG. 25, epoxy resins are applied as an adhesive, while, in FIG. 26, hot-melt adhesives are applied.

The blank IC card preparing apparatus of the present invention is provided with the first sheet material (being the reverse side sheet) in the form of a long roll of sheet and the second sheet material (being the surface side sheet) in the form of a long roll of sheet. Moisture curing type adhesives are supplied from the adhesive supply section onto the second sheet material under an atmosphere of nitrogen gas, employing a T die coating system. A 270 µm thick electronic part, fabricated as shown in FIG. 10, is also provided.

The sheet prepared by supplying the moisture curing type adhesives from the adhesive supply section onto the first sheet material under an atmosphere of nitrogen gas, employing a T die coating system, and the inlet comprising the electronic parts which is supplied to the second sheet material together with the moisture curing type adhesives are conveyed to a heating/pressure applying roller and (at a pressure of 3 kg/cm$^2$ and a roller surface temperature of 70° C.) a sheet shaped blank IC card which is regulated at 740 µm is produced.

In a cutting process, it is preferable that after completing the initial curing of the adhesives as well as achieving sufficient adhesion to the support, final cutting is carried out. When cutting properties are taken into account, it is not always necessary to allow the adhesives to be completely cured. The resulting sheet shaped blank IC card is cut employing a rotary cutter, whereby it is possible to produce blank IC cards of 55×85 mm, having an image recording layer.

When the surface and back of the finished blank card is not provided with a format printing section, a logo and an OP varnish are successively printed employing a wash-off resin relief printing method, employing a card printer. Further, described in the table are the production ambience of the blank IC cards of the present invention, moisture curing type adhesives, and conditions such as adhesive applying temperatures, and temperature during adhesion of the adhesives.

(Preparation Method of IC Card)

Method for describing an identification image and attribute information onto an IC card is described.

(Preparation of Ink Sheet for Sublimation Type Thermal Transfer Recording)

Each of a yellow ink layer forming coating composition, a magenta ink layer forming coating composition, and a cyan ink layer forming coating composition, having the compositions described below, was applied onto a 6 µm polyethylene terephthalate sheet, of which rear surface had been subjected to a fusion resistant treatment, so as to obtain a thickness of 1 µm, whereby three color ink sheets of yellow, magenta, and cyan were prepared.

<Yellow Ink Layer Forming Coating Composition>

| | |
|---|---|
| Yellow dye (MS Yellow, manufactured by Mitsui Toatsu Senryo Co., Ltd.) | 3 parts |
| Polyvinyl acetal (Denka Butyral KY-24, manufactured by Denki Kagaku Kogyo Kabushiki Kaisha) | 5.5 parts |
| Polymethyl methacrylate modified polystyrene (REZEDA GP-200, manufactured by Toagosei Co., Ltd.) | 1 part |
| Urethane modified silicone oil (Diaromer SP-2105, manufactured by Dainichiseika Color & Chemicals Mfg. Co., Ltd.) | 0.5 part |
| Methyl ethyl ketone | 70 parts |
| Toluene | 20 parts |

<Magenta Ink Layer Forming Coating Composition>

| | |
|---|---|
| Magenta dye (MS Magenta, manufactured by Mitsui Toatsu Senryo Co., Ltd.) | 2 parts |
| Polyvinyl acetal (Denka Butyral KY-24, manufactured by Denki Kagaku Kogyo Kabushiki Kaisha) | 5.5 parts |
| Polymethyl methacrylate modified polystyrene (REZEDA GP-200, manufactured by Toagosei Co., Ltd.) | 2 parts |
| Urethane modified silicone oil (Diaromer SP-2105, manufactured by Dainichiseika Color & Chemicals Mfg. Co., Ltd.) | 0.5 part |
| Methyl ethyl ketone | 70 parts |
| Toluene | 20 parts |

<Cyan Ink Layer Forming Coating Composition>

| | |
|---|---|
| Cyan dye (Kayaset Blue 136, manufactured by NIPPON KAYAKU CO., LTD.) | 3 parts |
| Polyvinyl acetal (Denka Butyral KY-24, manufactured by Denki Kagaku Kogyo Kabushiki Kaisha) | 5.6 parts |
| Polymethyl methacrylate modified polystyrene (REZEDA CP-200, manufactured by Toagosei Kogyo Co., Ltd.) | 1 part |
| Urethane modified silicone oil (Diaromer SP-2105, manufactured by Dainichi Seika Kogyo Co., Ltd.) | 0.5 part |
| Methyl ethyl ketone | 70 parts |
| Toluene | 20 parts |

(Preparation of Fusible Thermal Transfer Recording Ink Sheet)

An ink layer forming coating composition, having the composition described below, was applied onto a 6 µm thick polyethylene terephthalate sheet of which rear surface had been subjected to a fusion resistant treatment so as to obtain a coating thickness of 2 µm, whereby an ink sheet was prepared.

<Ink Layer Forming Coating Composition>

| | |
|---|---|
| Carnauba wax | 1 part |
| Ethylene vinyl acetate copolymer EV40Y, manufactured by Mitsui Dupont Chemical Co.) | 1 part |
| Carbon black | 3 parts |
| Phenol resin (Tamanol 521, manufactured by Arakawa Chemical Industries, Ltd.) | 5 parts |
| Methyl ethyl ketone | 90 parts |

(Formation of the Portrait Image)

An image receptive layer or a transparent resin section and information printing section was faced with the surface of the ink side of a sublimation thermal transfer recording ink sheet, and the ink sheet side was heated employing a thermal head under conditions of an output of 0.23 W/dot, a pulse width of 0.3 to 4.5 m second, and a dot density of 16 dots/mm, whereby a portrait image having gradation was formed. In said image, said dye and nickel in said receptive layer formed a complex.

(Recoeding of Text Information)

A transparent resin section or a scale-pattern pigment containing layer was faced with the surface of the ink side of a fusible thermal transfer recording ink sheet and the ink sheet side was heated employing a thermal head under conditions of an output of 0.5 W/dot, a pulse width of 1.0 m second, and a dot density of 16 dots/mm, whereby text information was formed on the image recording body for IC cards.

(Synthesis Example 1 of Resin Added to IC Card Surface Protective Layer)

Placed in a three-necked flask were 73 parts of methyl methacrylate, 15 parts of styrene, 12 parts of methacrylic acid, 500 parts of ethanol, and 3 parts of α,α'-azobisisobutylnitrile, and the resultant mixture underwent reaction in an oil bath at 80° C. under a flow of nitrogen for 6 hours. Thereafter, 3 parts of triethylammonium chloride and 1.0 part of glycidyl methacrylate were added and the resultant mixture underwent reaction for 3 hours, whereby an acryl based copolymer having Molecular weight of 17,000 and acid value of 32 was prepared.

(Protective Layer)

(Preparation of Transparent Resin Transfer Foil)

A coating composition, prepared by employing the formula described below, was applied onto one surface of polyethylene terephthalate (S-25), manufactured by Daifoil Hoechst Co., Ltd. employing wire bar coating, and subsequently dried, whereby Protective Layer was formed.

(Releasing Layer) Layer Thickness of 0.5 μm

| Acryl based resin (Dianal BR-87, manufactured by Mitsubishi Rayon Co., Ltd.) | 5 parts |
| Polyvinyl acetoacetal (having a SP value of 9.4, KS-1, manufactured by SEKISUI CHEMICAL CO., LTD.) | 5 parts |
| Methyl ethyl ketone | 40 parts |
| Toluene | 50 parts |

After coating, drying was carried out at 90° C. for 30 seconds.

<Interlayer Forming Coating Composition> Layer thickness of 0.3 μm

| Polyvinyl butyral resin (S-LEK BX-1, SEKISUI CHEMICAL CO., LTD. | 5 parts |
| Toughtex M-1913 (manufactured by Asahi Kasei Corporation) | 3.5 parts |
| Curing agent polyisocyanate (Coronate HX, manufactured by Nippon Polyurethane Industry Co., Ltd.) | 1.5 parts |
| Methyl ethyl ketone | 20 parts |
| Toluene | 70 parts |

After coating, drying was carried out at 90° C. for 30 seconds, while curing agent curing was carried out at 50° C. for 24 hours.

<Barrier Layer Forming Coating Composition>
Layer thickness of 0.5 μm

| Polyvinyl butyral resin (S-LEK BX-1, manufactured by SEKISUI CHEMICAL CO., LTD.) | 4 parts |
| Toughtex M-1913 (manufactured by Asahi Kasei Corporation) | 4 parts |
| Curing agent polyisocyanate (Coronate HX, manufactured by Nippon Polyurethane Industry Co., Ltd.) | 2 parts |
| Toluene | 50 parts |
| Methyl ethyl ketone | 40 parts |

After coating, drying was carried out at 70° C. for 30 seconds.

<Adhesion Layer Forming Coating Composition>
Layer thickness of 0.3 μm

| Urethane modified ethylene ethyl acrylate copolymer (Hightech S6254B, manufactured by Toho Chemical Industry Co., Ltd.) | 8 parts |
| Polyacrylic acid ester copolymer (JURYMER AT510, manufactured by Nihon Junyaku Co., Ltd.) | 2 parts |
| Water | 45 parts |
| Ethanol | 45 parts |

After coating, drying was carried out at 70° C. for 30 seconds.

Transparent Resin Transfer Foil, comprised of the releasing layer, the interlayer, and the adhesion layer comprised of the compositions as above, was prepared.

Transfer was carried out onto the aforesaid image receptive body which had been recorded with images and text, employing each transfer foil having a transparent protective layer, employing a ϕ5 cm heating roller having a rubber hardness of 85 heated at 200° C. under a pressure of 150 kg/cm$^2$ over 1.2 seconds.

The UV curable resin containing coating composition described below was applied onto the aforesaid image receptive body, which had been transferred with the aforesaid Transfer Foil, employing a gravure roll coater having the specified ground pattern so as to obtain a coating weight of 20 g/m$^2$, and was cured under the conditions described below, whereby a UV cured protective layer was formed.

| Curing Conditions | |
|---|---|
| Light source | 60 w/cm$^2$ high pressure mercury lamp |
| Exposure distance | 10 cm |
| Exposure mode | light scanning at 3 cm/second |

(UV Curable Resin Containing Coating Composition 1)

| Bis (3,4-epoxy-6-methylcyclohexylmethyl) adipate | 70 parts |
| Bisphenol A glycidyl ether | 10 parts |
| 1,4-Butanediol glycidyl ether | 13 parts |
| Triarylsulfoniumfluoroantimony | 7 parts |

(Evaluation of Physical Properties)

Elongation at fracture (in percent) of a resin was determined as follows. After curing under light, the resin was allowed to stand at 23° C. and 55 percent-relative humidity for at least 24 hours, and its elongation at fracture was then measured employing a Tensilon Universal Tester RTA 100 while employing a Tensilon Multifunctional Type MP-100/200S Ver. 44, for data processing.

The resin was secured employing an air chuck system. The crosshead speed was selected from 5 to 100 mm/minute, and RANGE was selected from 5 to 100 percent, while load was selected from 0.1 to 500 kg. In the present invention, evaluation was carried out at a crosshead speed of 30 mm/minute, a RANGE of 20 percent, and a load of 100 kg.

(Cutting Properties)

Sheets were die-cut into cards. The state of the resulting die-cut cards was evaluated based on 5 ranks. Ranks 4 and 5 were judged to be commercially viable.

5: The side of the card was smooth and had no burrs
4: The side of the card was slightly rough and dad no burrs, resulting in no transport problems in a printer
3: It was possible to die-cut cards, but the adhesive remained around the card, resulting in rough sides
2: It was possible to die-cut cards, but the adhesive bulged out from the periphery of cards and remained, making it nearly impossible to smoothly transport cards in the printer
1: The sheet material was cut but the adhesive was not cut, whereby the card was not die-cut but remained attached to the sheet.

(Coatability of Adhesives)

During sheet preparation, the resulting adhesive coating state was visually evaluated based on the 5 ranks below. Ranks 4 and 5 were judged to be commercially viable.

5: Uniform coating was carried out resulting in an even coating surface
4: Almost uniform coating was carried out even though the coated edges were slightly elevated
3: Coating mottles occurred on the coated surface
2: Coating mottles occurred, resulting in unevenness
1: Coating mottles occurred, resulting in non-coatable portions (Measurement of Peeling Resistance)

A laminated sheet was cut into 2.5 cm wide strips. Subsequently, by employing FUDO RHEO METER NRM-2002J, produced by Fudo Kogyo Co., Ltd., a non-adhesion portion of the edge of the laminated sheet was grasped and the upper part was secured, while the lower part was pulled. By employing such a process, the maximum force necessary to peel off was determined. The desired value was at least 1,500 g/2.5 cm. When the force was beyond the measurable range, the strip width was decreased and the resulting value was converted to terms of 2.5 cm.

(Transportability of Cards)

By employing the card printer shown in FIG. 3, each of the aforesaid cards was subjected to text printing, formation of a portrait, and formation of a transfer foil, and 10,000 cards were continuously processed. During this operation, the card transporting state was evaluated based on 5 ranks. Ranks 4 and 5 were judged to be commercially viable.

5: All cards exhibited good transportability as well as no printing problems
4: Fewer than 5 of the 10,000 cards exhibited poor transportability but no cards exhibited printing problems
3: Between 5 and 50 cards exhibited poor transportability, but no cards exhibited printing problems
2: Between 50 and 100 cards exhibited in poor transportability, and some cards exhibited printing problems
1: Almost all cards were not capable of being transported Table 1 shows the results of these evaluations. Based on the results in Table 1, examples according to the present invention resulted in cutting properties, card transportability, peeling resistance, adhesive coatability, and safety which were superior to comparative examples, whereby the desired effects of the present invention were achieved.

TABLE 1-a

| Adhesive | Softening Point of Adhesive (° C.) | MDI Amount (%) | Ambience during Preparation | | | | Ambience during Sheet Storage | | | During Cutting | |
|---|---|---|---|---|---|---|---|---|---|---|---|
| | | | *1 | *2 | *3 | *4 | *1 | *2 | *5 | *6 | *7 |
| QR3460 *8 | 58 | 3.1 | 20 | 20 | 120 | 12,000 | 23 | 55 | 14 | 800 | 18 |
| QR3460 *8 | 58 | 3.1 | 20 | 20 | 110 | 20,000 | 23 | 55 | 12 | 660 | 16 |
| QR3460 *8 | 58 | 3.1 | 20 | 70 | 100 | 45,000 | 40 | 55 | 7 | 840 | 17 |
| MK15-014 *9 | 58 | 0.9 | 20 | 20 | 130 | 15,000 | 23 | 55 | 20 | 820 | 17 |
| QR5110 *10 | 68 | 0.9 | 20 | 18 | 120 | 60,000 | 40 | 55 | 8 | 220 | 35 |
| QR5110 *10 | 66 | 0.9 | 23 | 70 | 140 | 30,000 | 23 | 55 | 7 | 215 | 35 |
| QR5110 *10 | 68 | 0.9 | 23 | 20 | 140 | 30,000 | 23 | 80 | 5 | 175 | 30 |
| MK15-014 *9 | 58 | 0.9 | 23 | 80 | 130 | 15,000 | 23 | 55 | 9 | 200 | 20 |
| MK15-014 *9 | 58 | 0.9 | 23 | 90 | 120 | 25,000 | 23 | 55 | 6 | 120 | 14 |
| MK15-014 *9 | 58 | 0.9 | 23 | 80 | 130 | 15,000 | 23 | 80 | 7 | 150 | 17 |
| MK15-014 *9 | 58 | 0.9 | 23 | 20 | 130 | 15,000 | 23 | 40 | 8 | 170 | 15.5 |
| Adhesive 1 | 58 | 0.9 | 23 | 70 | 130 | 11,500 | 23 | 55 | 5 | 280 | 45 |
| Adhesive 2 | 59 | 0.9 | 25 | 80 | 130 | 20,000 | 23 | 80 | 3 | 200 | 40 |
| Adhesive 3 | 60 | 0.9 | 20 | 15 | 120 | 30,000 | 23 | 40 | 7 | 280 | 41 |
| Adhesive 4 | 60 | 0.9 | 20 | 18 | 120 | 40,000 | 23 | 40 | 10 | 320 | 50 |

*1; Temperature (° C.)
*2; Humidity (%)
*3; Temperature during Coating (° C.)
*4; Viscosity during Coating (cp)
*5; Storage Period until Cutting (day)
*6; Elongation after Fracture (%)
*7; Elastic Modulus (kgf/mm$^2$)

TABLE 1-a-continued

| Adhesive | Softening Point of Adhesive (°C.) | MDI Amount (%) | Ambience during Preparation *1 *2 *3 *4 | Ambience during Sheet Storage *1 *2 *5 | During Cutting *6 *7 |
|---|---|---|---|---|---|

*8; Macroplast QR3460 Manufactured by Henkel Corp.
*9; Macroplast MK15-014 Manufactured by Henkel Corp.
*10; Macroplast QR5110 Manufactured by Henkel Corp.

TABLE 1-b

| Adhesive | After Completion of Curing *1 | *2 | *3 | Blade Angle Used for Die-Cutting (°) | *4 | *5 | *6 | Coat-ability of Adhesive | Security | Remarks |
|---|---|---|---|---|---|---|---|---|---|---|
| QR3460 *8 | 14 | 800 | 18 | 90 | 1 | 1 | 3,000 | 4 | Insufficient | Comp. |
| QR3460 *8 | 14 | 500 | 18 | 80 | 1 | 1 | 2,000 | 4 | Insufficient | Comp. |
| QR3460 *8 | 7 | 840 | 17 | 100 | 1 | 1 | 700 | 1 | Insufficient | Comp. |
| MK15-014 *9 | 25 | 900 | 18 | 90 | 1 | 1 | 4,000 | 5 | Good | Comp. |
| QR5110 *10 | 10 | 250 | 36 | 90 | *7 | 1 | 1,200 | 1 | Good | Comp. |
| QR5110 *10 | 10 | 240 | 38 | 90 | 4 | 5 | 5,000 | 4 | Good | Inv. |
| QR5110 *10 | 8 | 240 | 38 | 90 | 4 | 4 | 5,000 | 4 | Good | Inv. |
| MK15-014 *9 | 25 | 900 | 18 | 90 | 5 | 5 | 5,000 | 5 | Good | Inv. |
| MK15-014 *9 | 25 | 900 | 18 | 90 | 5 | 4 | 5,000 | 4 | Good | Inv. |
| MK15-014 *9 | 20 | 850 | 18 | 90 | 5 | 5 | 5,000 | 5 | Good | Inv. |
| MK15-014 *9 | 30 | 880 | 19 | 90 | 4 | 4 | 5,000 | 5 | Good | Inv. |
| Adhesive 1 | 12 | 380 | 26 | 90 | 5 | 5 | 5,000 | 5 | Good | Inv. |
| Adhesive 2 | 10 | 370 | 35 | 90 | 5 | 4 | 5,000 | 5 | Good | Inv. |
| Adhesive 3 | 9 | 350 | 40 | 85 | 5 | 4 | 4,000 | 4 | Good | Inv. |
| Adhesive 4 | 15 | 340 | 60 | 100 | 4 | 4 | 3,000 | 4 | Good | Inv. |

*1; Curing Completion Period (day)
*2; Elongation after Fracture (%)
*3; Elastic Modulus (kgf/mm²)
*4; Cutting Properties
*5; Card Transportability
*6; Peeling Resistance after Curing of Adhesive (g/2.5 cm)
*7; Cutting was impossible due to sheet expansion
*8; Macroplast QR3460 Manufactured by Henkel Corp.
*9; Macroplast MK15-014 Manufactured by Henkel Corp.
*10; Macroplast QR5110 Manufactured by Henkel Corp.
Comp.; Comparative Example
Inv.; Present Invention Example 2

Subsequently the angle of the cutting blade was varied and the adhesive described below was used in Example 2. Evaluation was carried out in the same manner as Example 1, with regard to levels shown in Table 2.

Adhesive 5 (Elastic Epoxy Adhesive)

Elastic Epoxy Adhesive Employed in the Present Invention):

The main agent was charged into Liquid A supply section, while employing Three Bond 3950 Set (exhibiting an elongation of fracture of 246 percent, an elastic modulus of 2 percent, and a viscosity of 30,000 mps after curing), produced by Three Bond Co., Ltd., while the hardening agent was charged into Liquid B supply section. Further, Ilidion 211, produced by Merck Co., was added to Liquid B in an amount of 3 percent by weight with respect to the aforesaid Liquid B.

When used, the adhesive supply section of the laminator was modified so that it was possible to mix Liquid A and Liquid B prior to use by providing Liquid A and Liquid B supply sections.

Adhesive 6 (Thermo-Curing Type Adhesive)

Thermo-Curing Type Adhesive of the Present Invention: Adhesive comprised of the composition described below Thermo-curing Type Adhesive Composition:

| | |
|---|---|
| Celloxide 2021 (having an epoxy equivalent of 128–140, produced by Daicel Kagaku Kogyo Co., Ltd.) | 38 parts |
| Epolite 3002 (produced by Kyoeisha Kagaku Co., Ltd.) | 25 parts |
| Epicoat #828 (having an epoxy equivalent of 184–194, produced by Yuka Shell Epoxy Co.) | 30 parts |
| Thermal cation generating compound SAN AIDS I-60L (produced by Sanshin Kagaku Kogyo Co., Ltd.) | 7 parts |

The compounds described above were charged into the adhesive supply section and the resulting adhesive was applied under the conditions previously described.

Table 2 shows the results. Based on the results in Table 2, examples according to the present invention resulted in cutting properties, card transportability, peeling resistance, adhesive coatability, and safety which were superior to comparative examples, whereby the desired effects of the present invention were achieved.

TABLE 2-a

| | Softening Point of Adhesive (° C.) | MDI Amount (%) | Ambience during Preparation | | | | Ambience during Sheet Storage | | During Cutting | | |
|---|---|---|---|---|---|---|---|---|---|---|---|
| | | | *1 | *2 | *3 | *4 | *1 | *2 | *5 | *6 | *7 |
| QR3460 *8 | 58 | 3.1 | 20 | 30 | 120 | 12,000 | 23 | 55 | 800 | 17.5 | 11 |
| QR3460 *8 | 58 | 3.1 | 20 | 30 | 100 | 45,000 | 23 | 55 | 790 | 16 | 12 |
| QR3460 *8 | 58 | 3.1 | 23 | 80 | 100 | 45,000 | 40 | 55 | 760 | 14 | 5 |
| MK15-014 *9 | 58 | 0.9 | 15 | 15 | 130 | 15,000 | 23 | 55 | 820 | 15 | 20 |
| QR5110 *10 | 68 | 0.9 | 23 | 70 | 140 | 30,000 | 23 | 55 | 230 | 35 | 8 |
| QR5110 *10 | 68 | 0.9 | 23 | 70 | 140 | 30,000 | 23 | 80 | 200 | 33 | 6 |
| MK15-014 *9 | 58 | 0.9 | 23 | 80 | 130 | 15,000 | 23 | 60 | 840 | 16 | 21 |
| MK15-014 *9 | 58 | 0.9 | 23 | 90 | 120 | 25,000 | 23 | 60 | 550 | 14 | 14 |
| MK15-014 *9 | 58 | 0.9 | 23 | 80 | 130 | 15,000 | 23 | 75 | 350 | 15 | 10 |
| MK15-014 *9 | 58 | 0.9 | 23 | 20 | 130 | 15,000 | 23 | 40 | 785 | 16 | 12 |
| Adhesive 1 | 58 | 0.9 | 23 | 70 | 130 | 11,500 | 23 | 60 | 220 | 24 | 8 |
| Adhesive 2 | 59 | 0.9 | 25 | 80 | 130 | 20,000 | 23 | 75 | 200 | 33 | 6 |
| Adhesive 3 | 60 | 0.9 | 20 | 15 | 120 | 30,000 | 23 | 45 | 330 | 35 | 7 |
| Adhesive 4 | 60 | 0.9 | 20 | 18 | 120 | 40,000 | 23 | 50 | 325 | 55 | 13 |
| Adhesive 5 | 55 | 0.1 | 20 | 20 | 100 | 7,000 | 23 | 60 | 200 | 22 | 1 |
| Adhesive 6 | 52 | 0.1 | 20 | 20 | 100 | 5,000 | 23 | 60 | 180 | 33 | 1 |

*1; Temperature (° C.)
*2; Humidity (%)
*3; Temperature during Coating (° C.)
*4; Viscosity during Coating (cp)
*5; Elongation after Fracture (%)
*6; Elastic Modulus (kgf/mm$^2$)
*7; Storage Period until Cutting (day)
*8; Macroplast QR3460 Manufactured by Henkel Corp.
*9; Macroplast MK15-014 Manufactured by Henkel Corp.
*10; Macroplast QR5110 Manufactured by Henkel Corp.

TABLE 2-b

| Adhesive | After Completion of Curing | | | | Cutting Properties | *5 | *6 | Coatability of Adhesive | Security | Remarks |
|---|---|---|---|---|---|---|---|---|---|---|
| | *1 | *2 | *3 | *4 | | | | | | |
| QR3460 *8 | 14 | 850 | 18 | 90 | 1 | 1 | 3,000 | 4 | Insufficient | Comp. |
| QR3460 *8 | 14 | 830 | 18 | 100 | 1 | 1 | 2,000 | 2 | Insufficient | Comp. |
| QR3460 *8 | 7 | 840 | 17 | 85 | 1 | 1 | 700 | 1 | Insufficient | Comp. |
| MK15-014 *9 | 25 | 840 | 18 | 80 | 1 | 1 | 4,000 | 5 | Good | Comp. |
| QR5110 *10 | 10 | 240 | 38 | 90 | 4 | 5 | 5,000 | 4 | Good | Inv. |
| QR5110 *10 | 8 | 240 | 38 | 30 | 4 | 4 | 5,000 | 4 | Good | Inv. |
| MK15-014 *9 | 25 | 900 | 18 | 28 | 5 | 5 | 5,000 | 5 | Good | Inv. |
| MK15-014 *9 | 24 | 900 | 18 | 30 | 5 | 4 | 5,000 | 4 | Good | Inv. |
| MK15-014 *9 | 20 | 850 | 18 | 35 | 5 | 5 | 5,000 | 5 | Good | Inv. |
| MK15-014 *9 | 30 | 880 | 19 | 32 | 4 | 4 | 5,000 | 5 | Good | Inv. |
| Adhesive 1 | 12 | 380 | 26 | 30 | 5 | 5 | 5,000 | 5 | Good | Inv. |
| Adhesive 2 | 10 | 370 | 35 | 35 | 5 | 4 | 5,000 | 5 | Good | Inv. |
| Adhesive 3 | 9 | 350 | 40 | 85 | 4 | 4 | 4,000 | 4 | Good | Inv. |
| Adhesive 4 | 15 | 340 | 60 | 90 | 4 | 4 | 3,000 | 4 | Good | Inv. |
| Adhesive 5 | 6 | 250 | 25 | 90 | 4 | 4 | 5,000 | 5 | Good | Inv. |
| Adhesive 6 | 6 | 240 | 45 | 50 | 4 | 4 | 5,000 | 5 | Good | Inv. |

*1; Curing Completion Period (day)
*2; Elongation after Fracture (%)
*3; Elastic Modulus (kgf/mm$^2$)
*4; Blade Angle Used for Die-Cutting (°)
*5; Card Transportability
*6; Peeling Resistance after Curing of Adhesive (g/2.5 cm)
*8; Macroplast QR3460 Manufactured by Henkel Corp.
*9; Macroplast MK15-014 Manufactured by Henkel Corp.
*10; Macroplast QR5110 Manufactured by Henkel Corp.
Comp.; Comparative Example
Inv.; Present Invention

What is claimed is:

1. A method for preparing an IC card having an IC module provided in an adhesive layer between a first substrate and a second substrate, the method comprising supplying an adhesive to a first sheet substrate for forming the first substrate and a second sheet substrate for forming the second substrate to form an adhesive layer, supplying an IC module containing an IC chip between the adhesive layers, adhering the first and the second sheet substrates to form a blanc IC card sheet having the IC module between the adhesive layers, and cutting the blanc IC card sheet to form a blanc IC card, wherein the adhesive contains diphenylmethanediisocyanate in an amount of less than 1.0 percent by weight based on the whole amount of the adhesive and has an elongation at fracture of the adhesive of 150–1,500 percent after complete curing, and the blanc IC card sheet is cut when an elongation at fracture of the adhesive of 5–500 percent prior to complete curing.

2. The method of claim 1, wherein the adhesive has an elastic modulus of 15–50 kgf/mm$^2$ after complete curing, and the blanc IC card sheet is cut when an elastic modulus of said adhesive is 5–15 kgf/mm$^2$ prior to complete curing.

3. The method of claim 1, wherein the adhesive has a viscosity of 5,000–40,000 cp during coating.

4. The method of claim 1, wherein the adhesive has a softening point of 50–80° C.

5. The method of claim 1, wherein the blanc IC card sheet is cut when the elongation at fracture of the adhesive is 300–1,000 percent and a cutting blade angle is 20–40 degrees.

6. The method of claim 1, wherein the blanc IC card sheet is cut when the elongation at fracture of an adhesive is 5–500 percent and a cutting blade angle is 80–100 degrees.

7. The method of claim 1, wherein adhering the first and the second sheet substrates is conducted at a temperature of 20–50° C. and a humidity of 70–100 percent.

8. The method of claim 1, wherein the blanc IC card sheet is kept standing at a temperature of 20–50° C. and a humidity of 40–100 percent before the cutting.

9. The method of claim 1, wherein the first and a second sheet substrates are in a form of a long sheet, and the blanc IC card sheet is cut to form a blanc IC card sheet in a form of a leaf containing a plurality of blanc IC cards, and the blanc IC card sheet in a form of a leaf is cut to form the blanc IC card.

10. The method of claim 1, wherein a format is printed on the blanc IC card sheet before cutting.

11. The method of claim 10, wherein unevenness of the front surface side sheet of peripheral portion of the IC module of is within ±10 μm with respect to flatness.

12. The method of claim 1, wherein the method further comprises providing an image receiving layer on at least one side of the first or second substrate by a sublimation thermal transfer system, a fusion thermal transfer system, or an ink jet printing system.

13. The method of claim 12, wherein a transparent protective layer is provided on an upper surface which includes personal identification information comprising name and portrait and the transparent protective layer is comprised of an actinic radiation curing resin.

14. The method of claim 12, wherein an IC module is provided in a position which does not overlap the portrait.

15. The method of claim 1, wherein the method further comprises providing a writing layer on at least a part of the first or second substrate.

16. An IC card having an IC module provided in an adhesive layer between a first substrate and a second substrate, comprising: a first sheet substrate having an adhesive layer forming a first substrate and a second sheet substrate having an adhesive layer forming a second substrate, an IC module containing an IC chip positioned between the adhesive layers, wherein: the first and the second sheet substrates are structurally adhered together to form a blanc IC card sheet having the IC module between the adhesive layers, and a blanc IC card formed at least one cut in the blanc IC card sheet, wherein the adhesive contains diphenylmethanediisocyanate in an amount of less than 1.0 percent by weight based the whole amount of the adhesive and has an elongation at fracture of the adhesive of 150–1,500 percent after complete curing, and the blanc card sheet is cut when an elongation at fracture of the adhesive of 5–500 percent prior to complete curing.

* * * * *